US012777893B2

(12) United States Patent
Okuno et al.

(10) Patent No.: US 12,777,893 B2
(45) Date of Patent: Oct. 27, 2026

(54) MULTILAYER BODY, RELEASE AGENT COMPOSITION, AND METHOD FOR PRODUCING PROCESSED SEMICONDUCTOR SUBSTRATE

(71) Applicant: NISSAN CHEMICAL CORPORATION, Tokyo (JP)

(72) Inventors: Takahisa Okuno, Toyama (JP); Hiroto Ogata, Toyama (JP); Masaki Yanai, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 706 days.

(21) Appl. No.: 18/017,229

(22) PCT Filed: Jul. 15, 2021

(86) PCT No.: PCT/JP2021/026650

§ 371 (c)(1),
(2) Date: Jan. 20, 2023

(87) PCT Pub. No.: WO2022/019211

PCT Pub. Date: Jan. 27, 2022

(65) Prior Publication Data

US 2023/0298923 A1 Sep. 21, 2023

(30) Foreign Application Priority Data

Jul. 22, 2020 (JP) ................................ 2020-125727

(51) Int. Cl.

| | |
|---|---|
| ***H10P 72/70*** | (2026.01) |
| ***C09J 7/40*** | (2018.01) |
| ***C09J 183/04*** | (2006.01) |
| ***H10P 70/00*** | (2026.01) |

(52) U.S. Cl.

CPC ................ *H10P 72/74* (2026.01); *C09J 7/40* (2018.01); *C09J 183/04* (2013.01); *H10P 70/20* (2026.01); *C09J 2301/416* (2020.08); *C09J 2301/502* (2020.08); *H10P 72/7416* (2026.01); *H10P 72/7444* (2026.01)

(58) Field of Classification Search

None

See application file for complete search history.

(56) References Cited

U.S. PATENT DOCUMENTS

| | | | |
|---|---|---|---|
| 2009/0156775 | A1 | 6/2009 | Sakamoto et al. |
| 2014/0319502 | A1 | 10/2014 | Umemoto |
| 2020/0353735 | A1 | 11/2020 | Ogino et al. |

FOREIGN PATENT DOCUMENTS

| | | | | | |
|---|---|---|---|---|---|
| CN | 101336263 | A | | 12/2008 | |
| CN | 111316401 | A | * | 6/2020 | ................ C09J 5/02 |
| JP | 2004-64040 | A | | 2/2004 | |
| JP | 2008266433 | A | * | 11/2008 | |
| JP | 2012-106486 | A | | 6/2012 | |
| JP | 2019-203092 | A | | 11/2019 | |
| TW | 201933460 | A | | 8/2019 | |
| WO | WO 2014/104060 | A1 | | 7/2014 | |
| WO | WO 2016/143583 | A1 | | 9/2016 | |
| WO | WO 2018/142815 | A1 | | 8/2018 | |

OTHER PUBLICATIONS

CN 111316401 A Eng Trans (Year: 2020).*
JP 2008266433 A Eng Trans (Year: 2008).*
ISR for PCT/JP2021/026650, dated Sep. 28, 2021 (w/ translation).
Written Opinion for PCT/JP2021/026650, dated Sep. 28, 2021 (w/ translation).
Office Action for TW App. No. 110126457, dated Oct. 4, 2024 (w/ translation).
ESR for EP App. No. 21845196.1, dated Jul. 26, 2024.

* cited by examiner

*Primary Examiner* — Jeffrey D Washville

(74) *Attorney, Agent, or Firm* — Greenblum & Bernstein, P.L.C.

(57) ABSTRACT

A laminate having a semiconductor substrate, a support substrate, and an adhesive layer and a release layer disposed between the semiconductor substrate and the support substrate, wherein the release layer is a film formed from a releasing agent composition containing an organic resin, a branched-chain polysilane, and a solvent.

25 Claims, No Drawings

MULTILAYER BODY, RELEASE AGENT COMPOSITION, AND METHOD FOR PRODUCING PROCESSED SEMICONDUCTOR SUBSTRATE

TECHNICAL FIELD

The present invention relates to a laminate, to a releasing agent composition, and to a method for producing a processed semiconductor substrate (hereinafter may be referred to as a "processed semiconductor substrate production method").

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked with wire connection by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

More specifically, one required performance includes having high stress (i.e., strong adhesion) within the plane during polishing and low stress (i.e., weak adhesion) toward the thickness direction during detachment.

Regarding the above-mentioned procedure, there have been reported some techniques for a bonding and debonding process based on laser irradiation (see, for example, Patent Documents 1 and 2). However, according to a recent further development in the semiconductor field, there is continuous demand for a new technique involved in debonding through exposure to light (e.g., laser light).

PRIOR ART DOCUMENTS

Patent Documents

Patent Document 1: Japanese Patent Application Laid-Open (kokai) No. 2004-64040

Patent Document 2: Japanese Patent Application Laid-Open (kokai) No. 2012-106486

SUMMARY OF THE INVENTION

Problems to be Solved by the Invention

The present invention has been conceived under such circumstances. Thus, an object of the present invention is to provide a laminate having a release layer which exhibits excellent heat resistance during joining of a semiconductor substrate to a support substrate, processing of the back surface of the semiconductor substrate, and a device-mounting process or a like process; which can be readily peeled in separation of a support substrate or a semiconductor substrate; and which cannot be completely removed by an organic solvent, an acid, or a chemical liquid (e.g., an alkaline developer or hydrogen peroxide solution (i.e., aqueous hydrogen peroxide) usually employed in production of semiconductor elements, but can be suitably removed by a particular cleaning agent composition. Another object of the present invention is to provide a releasing agent composition which provides a film suitably serving as such a release layer. Still another object is to provide a processed semiconductor substrate production method employing such a laminate.

Means for Solving the Problems

The present inventors have conducted extensive studies for solving the problems, and have found that the above objects can be attained by a laminate having a semiconductor substrate, a support substrate, and an adhesive layer and a release layer disposed between the semiconductor substrate and the support substrate, wherein the release layer used in the laminate is a film formed from a releasing agent composition containing an organic resin, a branched-chain polysilane, and a solvent. The present invention has been accomplished on the basis of this finding.

Accordingly, the present invention provides the following.

1. A laminate comprising
a semiconductor substrate,
a support substrate, and
an adhesive layer and a release layer disposed between the semiconductor substrate and the support substrate, characterized in that
the release layer is a film formed from a releasing agent composition containing an organic resin, a branched-chain polysilane, and a solvent.

2. A laminate according to 1 above, wherein the branched-chain polysilane includes a structural unit represented by formula (B):

[F1]

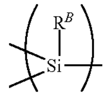

(B)

(wherein $R^B$ represents a hydrogen atom, a hydroxyl group, a silyl group, or an organic group).

3. A laminate according to 2 above, wherein $R^B$ is an aryl group.

4. A laminate according to 3 above, wherein $R^B$ is a phenyl group.

5. A laminate according to any of 1 to 4 above, wherein the branched-chain polysilane has a weight-average molecular weight of 50 to 30,000.

6. A laminate according to any of 1 to 5 above, wherein the branched-chain polysilane has a 5% weight loss temperature of 300° C. or higher.

7. A laminate according to any of 1 to 6 above, wherein the organic resin is a novolak resin.

8. A laminate according to 7 above, wherein the novolak resin is a polymer including one or more members selected from the group consisting of a unit represented by formula (C1-1), a unit represented by formula (C1-2), and a unit represented by formula (C1-3):

[F2]

(C1-1)

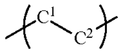

(C1-2)

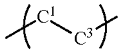

(C1-3)

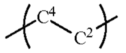

(wherein $C^1$ represents a group derived from a nitrogen-atom containing aromatic compound; $C^2$ represents a group including a tertiary carbon atom to which, as a side chain, at least one member selected from the group consisting of a secondary carbon atom, a quaternary carbon atom, and an aromatic ring is bonded; $C^3$ represents a group derived from an aliphatic polycyclic compound; and $C^4$ represents a group derived from a phenol, a group derived from bisphenol, a group derived from naphthol, a group derived from biphenyl, or a group derived from biphenol).

9. A laminate according to any of 1 to 8 above, wherein the releasing agent composition contains a cross-linking agent.

10. A laminate according to any of 1 to 9 above, wherein the adhesive layer is a film formed from an adhesive composition containing an adhesive component (S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

11. A laminate according to 10 above, wherein the adhesive component (S) contains a polysiloxane adhesive.

12. A laminate according to 11 above, wherein the polysiloxane adhesive contains a polysiloxane component (A) which is curable through hydrosilylation.

13. A releasing agent composition for forming a release layer of a laminate comprising a semiconductor substrate, a support substrate, and an adhesive layer and the release layer disposed between the semiconductor substrate and the support substrate, characterized in that the releasing agent composition comprising an organic resin, a branched-chain polysilane, and a solvent.

14. A releasing agent composition according to 13 above, wherein the branched-chain polysilane includes a structural unit represented by formula (B):

[F3]

(B)

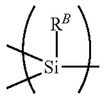

(wherein $R^B$ represents a hydrogen atom, a hydroxyl group, a silyl group, or an organic group).

15. A releasing agent composition according to 14 above, wherein $R^B$ is an aryl group.

16. A releasing agent composition according to 15 above, wherein $R^B$ is a phenyl group.

17. A releasing agent composition according to any of 13 to 16 above, wherein the branched-chain polysilane has a weight-average molecular weight of 50 to 30,000.

18. A releasing agent composition according to any of 13 to 17 above, wherein the branched-chain polysilane has a 5% weight loss temperature of 300° C. or higher.

19. A releasing agent composition according to any of 13 to 18 above, wherein the organic resin is a novolak resin.

20. A releasing agent composition according to 19 above, wherein the novolak resin is a polymer including one or more members selected from the group consisting of a unit represented by formula (C1-1), a unit represented by formula (C1-2), and a unit represented by formula (C1-3):

[F4]

(C1-1)

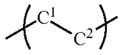

(C1-2)

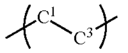

(C1-3)

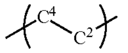

(wherein $C^1$ represents a group derived from a nitrogen-atom containing aromatic compound; $C^2$ represents a group including a tertiary carbon atom to which, as a side chain, at least one member selected from the group consisting of a secondary carbon atom, a quaternary carbon atom, and an aromatic ring is bonded; $C^3$ represents a group derived from an aliphatic polycyclic compound; and $C^4$ represents a group derived from a phenol, a group derived from bisphenol, a group derived from naphthol, a group derived from biphenyl, or a group derived from biphenol).

21. A releasing agent composition according to any of 13 to 20 above, which contains a cross-linking agent.

22. A releasing agent composition according to any of 13 to 21 above, wherein the adhesive layer is a film formed from an adhesive composition containing an adhesive component (S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

23. A releasing agent composition according to 22 above, wherein the adhesive component (S) contains a polysiloxane adhesive.

24. A releasing agent composition according to 23 above, wherein the polysiloxane adhesive contains a polysiloxane component (A) which is curable through hydrosilylation.
25. A processed semiconductor substrate production method comprising:
a first step of processing a semiconductor substrate of a laminate as recited in any of 1 to 12;
a second step of separating the semiconductor substrate from the support substrate; and
a third step of cleaning the separated semiconductor substrate with a cleaning agent composition.
26. A processed semiconductor substrate production method according to 25 above, wherein the second step includes a step of irradiating the release layer with light.
27. A processed semiconductor substrate production method according to 25 or 26 above, wherein the cleaning agent composition contains a quaternary ammonium salt and an organic solvent.
28. A processed semiconductor substrate production method according to 27 above, wherein the quaternary ammonium salt is a halogen-containing quaternary ammonium salt.
29. A processed semiconductor substrate production method according to 28 above, wherein the halogen-containing quaternary ammonium salt is a fluorine-containing quaternary ammonium salt.

Effects of the Invention

The laminate of the present invention has a semiconductor substrate, a support substrate, and an adhesive layer and a release layer disposed between the semiconductor substrate and the support substrate, wherein the release layer is a film formed from a releasing agent composition containing an organic resin, a branched-chain polysilane, and a solvent. Thus, the semiconductor substrate can be separated from the support substrate without applying excessive load to the semiconductor substrate for debonding. In addition, through cleaning the separated semiconductor substrate with a cleaning agent composition, the substrate can be suitably cleaned without leaving the residue of the release layer on the substrate.

Particularly when the support substrate of the laminate of the present invention has light transparency, the organic resin contained in the release layer absorbs light upon irradiation of the release layer with light from the support substrate side, to thereby advantageously cause necessary denaturation for achieving suitable debonding performance. As a result, the semiconductor substrate can be separated from the support substrate without applying excessive physical load to the semiconductor substrate for debonding. In addition, through cleaning the separated semiconductor substrate with a cleaning agent composition, the substrate can be suitably cleaned without leaving the residue of the release layer on the substrate.

Also, the release layer included in the laminate of the present invention cannot be suitably (completely) removed by any of an organic solvent, an acid, and a chemical liquid (e.g., an alkaline developer or hydrogen peroxide solution) employed in production of semiconductor elements.

By use of the laminate of the present invention having the aforementioned properties, in one case where, after processing of the backside of a silicon wafer (i.e., a semiconductor substrate), the processed silicon wafer can be easily separated from a glass substrate (i.e., a support substrate), without applying excessive load for debonding. In particular, when the support substrate has light transparency, the processed silicon wafer can be more easily separated from the support substrate by irradiating the laminate with light from the support substrate side, without applying further excessive load for debonding. As a result, mechanical stress which would otherwise be applied to the silicon wafer can be avoided, whereby damage (e.g., warpage or deformation) of the silicon wafer is prevented.

As described above, the release layer included in the laminate of the present invention cannot be suitably removed by an organic solvent, an acid, and a chemical liquid (e.g., an alkaline developer or hydrogen peroxide solution) employed in production of semiconductor elements. Thus, even when the laminate is unintentionally exposed to any of an organic solvent, an acid, and a chemical liquid employed in production of semiconductor elements, to thereby cause the release layer to come into contact with the chemical liquid, before finally separating the semiconductor substrate from the support substrate, possibility of occurrence of unintentional debonding is satisfactorily reduced. Instead, the release layer can be suitably removed by a cleaning agent composition. Thus, after separation of the semiconductor substrate from the support substrate, the separated semiconductor substrate can be suitably cleaned by use of the cleaning agent composition, without leaving the residue of the release layer on the semiconductor substrate.

The releasing agent composition of the present invention, containing an organic resin, a solvent, and a branched-chain polysilane, can readily provide a film having high uniformity at high reproducibility through a wet coating method (e.g., spin coating). In addition, when the organic resin contained in the releasing agent composition is degraded through light absorption, favorable modification occurs in the film formed from the releasing agent composition upon irradiation with light. In such a case, excellent debonding performance can be achieved, thereby providing enhanced debondability.

Since the releasing agent composition contains a branched-chain polysilane, the film formed from the releasing agent composition cannot be suitably removed by any of an organic solvent, an acid, and a chemical liquid (e.g., an alkaline developer or hydrogen peroxide solution) employed in production of semiconductor elements. However, the film can be suitably removed by use of a cleaning agent composition.

From the releasing agent composition of the present invention having the aforementioned properties, a film serving as the release layer is formed. By virtue of the film provided in combination with the adhesive layer between the semiconductor substrate and the support substrate, there can be provided a laminate which is debondable without applying excessive load for debonding to workpieces to be processed (e.g., a support substrate and a semiconductor substrate). In particular, when the support substrate has light transparency, there can be provided a laminate which is debondable without applying further excessive load for debonding to workpieces to be processed (e.g., a support substrate and a semiconductor substrate), by irradiating the laminate with light from the support substrate side. Even when such a laminate is unintentionally exposed, in semiconductor element production processes, to any of an organic solvent, an acid, and a chemical liquid (e.g., an alkaline developer or hydrogen peroxide solution) employed in production of semiconductor elements, possibility of occurrence of unintentional debonding is sufficiently reduced. Instead, the release layer can be suitably removed by a cleaning agent composition. Thus, after separation of the semiconductor substrate from the support substrate, the separated semiconductor substrate can be suitably cleaned by use of the cleaning agent composition, without leaving the residue of the release layer on the semiconductor substrate.

By use of the laminate and releasing agent composition of the present invention having the aforementioned properties, a favorable processed semiconductor substrate production method can be attained, whereby more reliable production of semiconductor elements can be expected.

MODES FOR CARRYING OUT THE INVENTION

The laminate of the present invention has a semiconductor substrate, a support substrate, and an adhesive layer and a release layer disposed between the semiconductor substrate and the support substrate, wherein the release layer is a film formed from a releasing agent composition containing an organic resin, a branched-chain polysilane, and a solvent.

The semiconductor substrate is, for example, a wafer. No particular limitation is imposed on the semiconductor substrate, and a specific example thereof is a silicon wafer having a diameter of about 300 mm and a thickness of about 770 μm.

The support substrate is a support (carrier) which is joined to sustain the semiconductor substrate.

No particular limitation is imposed on the support substrate, so long as it can sustain the semiconductor substrate by the mediation of function layers such as an adhesive layer and a release layer. In the case where the support substrate is removed from the semiconductor substrate through debonding by irradiating the release layer with light from the support substrate side, the support substrate must exhibit light transparency.

The transmittance of the support substrate in debonding by light irradiation is generally 50% or higher, preferably 60% or higher, more preferably 70% or higher, yet more preferably 80% or higher, still more preferably 90% or higher.

No particular limitation is imposed on the wavelength of the light employed in debonding, so long as the light has a wavelength allowing absorption by the organic resin. Generally, the light has a wavelength ranging from 100 nm to 600 nm. For example, a preferred wavelength of the light is 308 nm, 343 nm, 355 nm, or 365 nm. The dose of the light required to cause debonding is a dose which allows to invoke the below-mentioned suitable denaturation (e.g., decomposition).

The light employed for debonding may be laser light or non-laser light generated by a light source (e.g., a lamp).

No particular limitation is imposed on the support substrate, and one example thereof is a glass wafer having a diameter of about 300 mm and a thickness of about 700 μm.

In one embodiment, the laminate of the present invention has a semiconductor substrate, a support substrate, and only two layers between the semiconductor substrate and the support substrate, wherein one of the two layers is an adhesive layer, and the other is a release layer.

In a preferred embodiment, the laminate of the present invention includes a semiconductor substrate, a support substrate, an adhesive layer disposed between the semiconductor substrate and the support substrate so as to come into contact with the semiconductor substrate, and a release layer disposed so as to come into contact with the support substrate and the adhesive layer. In a further embodiment, the support substrate has light transparency, and the organic resin absorbs light upon irradiation to thereby cause denaturation thereof. Thus, the laminate of the present invention can be successfully debonded by irradiating the release layer with light.

When the support substrate of the laminate of the present invention has light transparency, debonding can be achieved without applying excessive load for peeling, by irradiating the release layer with light from the support substrate side. As a result, the semiconductor substrate can be easily separated from the support substrate.

In other words, when the support substrate of the laminate of the present invention has light transparency, the release layer included in the laminate of the present invention exhibits enhanced debonding performance through irradiation with light from the support substrate side, as compared with the state before light irradiation. In the laminate of the present invention, the semiconductor substrate (e.g., a silicon wafer) is suitably supported by a light-transmissive support substrate (e.g., a glass wafer) by the mediation of function layers such as the adhesive layer and the release layer, while processing (e.g., thinning) of the silicon wafer is performed. After completion of the processing, the laminate is irradiated with light from the support substrate side, whereby the light passing through the support substrate is absorbed by the release layer. Through the light absorption, separation or decomposition of the release layer occurs at the interface between the release layer and the adhesive layer, at the interface between the release layer and the support substrate or the semiconductor substrate, or in the release layer. As a result, debonding can be suitably achieved without applying excessive load for peeling.

Further, as mentioned below, the separated semiconductor substrate is cleaned by use of the cleaning agent composition, to thereby suitably clean the substrate without leaving the residue of the release layer on the semiconductor substrate.

As described above, the release layer included in the laminate of the present invention is a film formed from a releasing agent composition containing an organic resin, a branched-chain polysilane, and a solvent. In one embodiment, the film is a cured film formed through hardening the film-forming component(s) contained in the releasing agent composition.

The releasing agent composition contains an organic resin. The organic resin is preferably an organic resin which can provide suitable debonding performance. In the case where separation of the semiconductor substrate from the support substrate is conducted by irradiating the release layer with light, the organic resin essentially absorbs light, to thereby suitably cause denaturation (e.g., decomposition) required for enhancing debonding performance.

The organic resin is preferably, for example, a novolak resin.

When the release layer included in the laminate of the present invention is irradiated with light for debonding, a novolak resin that denatures through absorption of light having a wavelength of 190 nm to 600 nm is preferably used. More preferably, a novolak resin that denatures through irradiation with light (e.g., laser light having a wavelength of 308 nm, 343 nm, 355 nm, or 365 nm) is used.

A specific example of the novolak resin is a polymer including one or more members selected from the group consisting of a unit represented by formula (C1-1), a unit represented by formula (C1-2), and a unit represented by formula (C1-3).

[F5]

(C1-1)

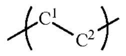

(C1-2)

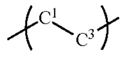

(C1-3)

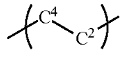

$C^1$ represents a group derived from a nitrogen-atom containing aromatic compound; $C^2$ represents a group containing a tertiary carbon atom to which, as a side chain, at least one member selected from the group consisting of a secondary carbon atom, a quaternary carbon atom, and an aromatic ring is bonded; $C^3$ represents a group derived from an aliphatic polycyclic compound; and $C^4$ represents a group derived from phenol, a group derived from bisphenol, a group derived from naphthol, a group derived from biphenyl, or a group derived from biphenol.

Thus, the polymer (novolak resin) includes one or more members selected from the group consisting of a unit (formula (C1-1)) having a bond between a group derived from a nitrogen-atom containing aromatic compound and a group containing a tertiary carbon atom to which, as a side chain, at least one member selected from the group consisting of a secondary carbon atom, a quaternary carbon atom, and an aromatic ring is bonded; a unit (formula (C1-2)) having a bond between a group derived from a nitrogen-atom containing aromatic compound and a group derived from an aliphatic polycyclic compound; and a unit (formula (C1-3)) having a bond between a group derived from phenol, a group derived from bisphenol, a group derived from naphthol, a group derived from biphenyl, or a group derived from biphenol and a group containing a tertiary carbon atom to which, as a side chain, at least one member selected from the group consisting of a quaternary carbon atom and an aromatic ring is bonded.

In a preferred embodiment, the polymer (novolak resin) includes either or both of a unit (formula (C1-1)) having a bond between a group derived from a nitrogen-atom containing aromatic compound and a group containing a tertiary carbon atom to which, as a side chain, at least one member selected from the group consisting of a secondary carbon atom, a quaternary carbon atom, and an aromatic ring is bonded; and a unit (formula (C1-2)) having a bond between a group derived from a nitrogen-atom containing aromatic compound and a group derived from an aliphatic polycyclic compound.

The group represented by $C^1$ (i.e., the group derived from a nitrogen-atom containing aromatic compound) may be, but not limited to, for example, a group derived from carbazole, a group derived from N-phenyl-1-naphthylamine, or a group derived from N-phenyl-2-naphthylamine-1-naphthylamine.

The group represented by $C^2$ (i.e., the group containing a tertiary carbon atom to which, as a side chain, at least one member selected from the group consisting of a secondary carbon atom, a quaternary carbon atom, and an aromatic ring is bonded) may be, but not limited to, for example, a group derived from 1-naphthaldehyde, a group derived from a 1-pyrenecarboxaldehyde, a group derived from 4-(trifluoromethyl)benzaldehyde, or a group derived from acetaldehyde.

The group represented by $C^3$ (i.e., the group derived from an aliphatic polycyclic compound) may be, but not limited to, a group derived from dicyclopentadiene.

$C^4$ is a group derived from phenol, a group derived from bisphenol, a group derived from naphthol, a group derived from biphenyl, or a group derived from biphenol.

In a preferred embodiment, the aforementioned polymer includes, for example, a unit represented by formula (C1-1-1) as the unit represented by formula (C1-1).

[F6]

(C1-1-1)

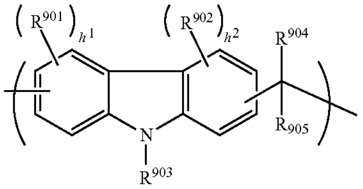

In formula (C1-1-1), each of $R^{901}$ and $R^{902}$, which are substituents on the corresponding rings, independently represents a halogen atom, a nitro group, a cyano group, an amino group, a hydroxy group, a carboxyl group, an optionally substituted alkyl group, an optionally substituted alkenyl group, or an optionally substituted aryl group; $R^{903}$ represents a hydrogen atom, an optionally substituted alkyl group, an optionally substituted alkenyl group, or an optionally substituted aryl group; $R^{904}$ represents a hydrogen atom, an optionally substituted aryl group, or an optionally substituted heteroaryl group; and $R^{905}$ represents an optionally substituted alkyl group, an optionally substituted aryl group, or an optionally substituted heteroaryl group. The groups represented by $R^{904}$ and $R^{905}$ may be bonded together to form a divalent group. Examples of the substituent of the alkyl or alkenyl group include a halogen atom, a nitro group, a cyano group, an amino group, a hydroxy group, a carboxyl group, an aryl group, and a heteroaryl group, and examples of the substituent of the aryl or heteroaryl group include a halogen atom, a nitro group, a cyano group, an amino group, a hydroxy group, a carboxyl group, an alkyl group, and an alkenyl group.

In formula (C1-1-1), each of $h^1$ and $h^2$ is independently an integer of 0 to 3.

The number of carbon atoms of the optionally substituted alkyl or alkenyl group is generally 40 or less. From the viewpoint of solubility, the number of carbon atoms is preferably 30 or less, more preferably 20 or less.

The number of carbon atoms of the optionally substituted aryl or heteroaryl group is generally 40 or less. From the viewpoint of solubility, the number of carbon atoms is preferably 30 or less, more preferably 20 or less.

Examples of the halogen atom include a fluorine atom, a chlorine atom, a bromine atom, and an iodine atom.

Specific examples of the optionally substituted alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Specific examples of the optionally substituted alkenyl group but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-tert-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Specific examples of the optionally substituted aryl group include, but are not limited to, phenyl, 2-methylphenyl, 3-methylphenyl, 4-methylphenyl, 2-chlorophenyl, 3-chlorophenyl, 4-chlorophenyl, 2-fluorophenyl, 3-fluorophenyl, 4-fluorophenyl, 4-methoxyphenyl, 4-ethoxyphenyl, 4-nitrophenyl, 4-cyanophenyl, 1-naphthyl, 2-naphthyl, biphenyl-4-yl, biphenyl-3-yl, biphenyl-2-yl, 1-anthryl, 2-anthryl, 9-anthryl, 1-phenanthryl, 2-phenanthryl, 3-phenanthryl, 4-phenanthryl, and 9-phenanthryl.

Specific examples of the optionally substituted heteroaryl group include, but are not limited to, 2-thienyl, 3-thienyl, 2-furanyl, 3-furanyl, 2-oxazolyl, 4-oxazolyl, 5-oxazolyl, 3-isoxazolyl, 4-isoxazolyl, 5-isoxazolyl, 2-thiazolyl, 4-thiazolyl, 5-thiazolyl, 3-isothiazolyl, 4-isothiazolyl, and 5-isothiazolyl.

Specific examples of the unit represented by formula (C1-1-1) include, but are not limited to, those described below.

[F7]

(C1-1-1-1)

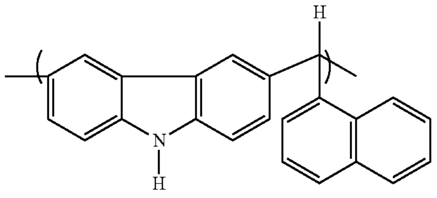

(C1-1-1-2)

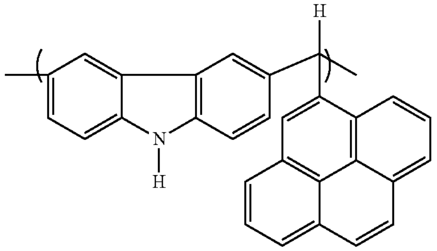

(C1-1-1-3)

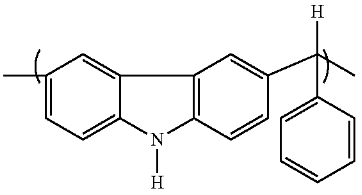

(C1-1-1-4)

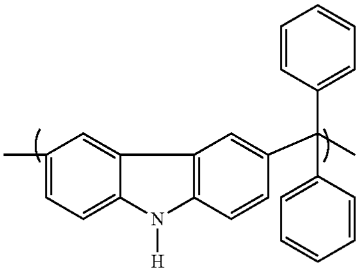

(C1-1-1-5)

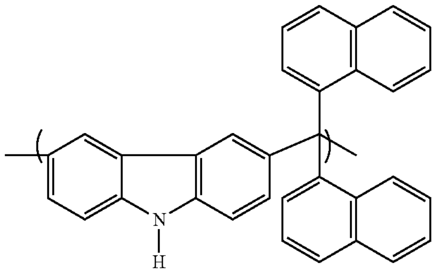

In a preferred embodiment, the aforementioned polymer includes, for example, a unit represented by formula (C1-1-2) as the unit represented by formula (C1-1).

[F8]

(C1-1-2)

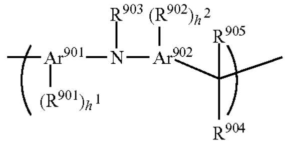

In formula (C1-1-2), each of $Ar^{901}$ and $Ar^{902}$ independently represents an aromatic ring such as a benzene ring or a naphthalene ring; and $R^{901}$ to $R^{905}$ and $h^1$ and $h^2$ have the same meanings as defined above.

Specific examples of the unit represented by formula (C1-1-2) include, but are not limited to, those described below.

[F9]

(C1-1-2-1)

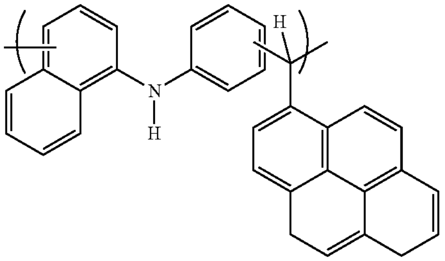

(C1-1-2-2)

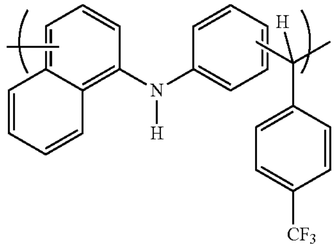

(C1-1-2-3)

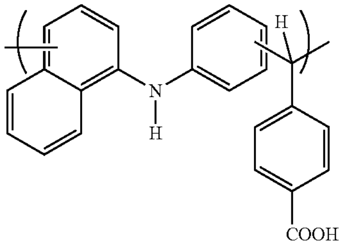

(C1-1-2-4)

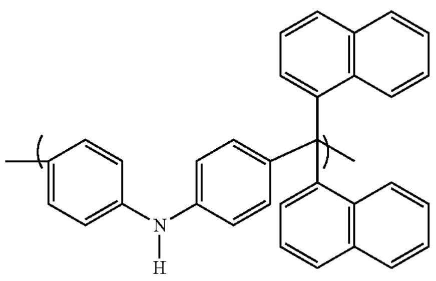

(C1-1-2-5)

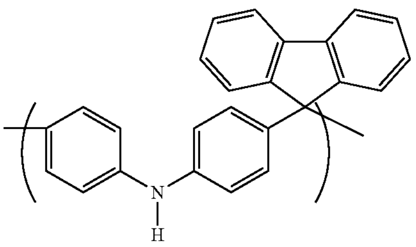

In a preferred embodiment, the aforementioned polymer includes, for example, a unit represented by formula (C1-2-1) or (C1-2-2) as the unit represented by formula (C1-2).

[F10]

(C1-2-1)

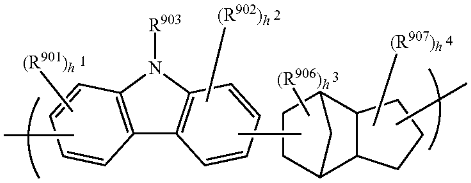

(C1-2-2)

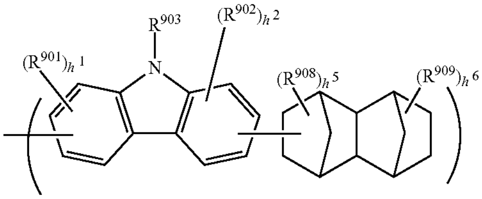

In the aforementioned formulae, each of $R^{906}$ to $R^{909}$, which are substituents bonded to the corresponding rings, independently represents a halogen atom, a nitro group, a cyano group, an amino group, a hydroxy group, a carboxyl group, an optionally substituted alkyl group, an optionally substituted alkenyl group, or an optionally substituted aryl group. Specific examples of the halogen atom, optionally substituted alkyl group, optionally substituted alkenyl group, and optionally substituted aryl group, and preferred numbers of carbon atoms of these groups are the same as those described above. In the aforementioned formulae, each of $h^3$ to $h^6$ independently represents an integer of 0 to 3, and $R^{901}$ to $R^{903}$ and $h^1$ and $h^2$ have the same meanings as defined above.

Specific examples of the units represented by formulae (C1-2-1) and (C1-2-2) include, but are not limited to, those described below.

[F11]

(C1-2-1-1)

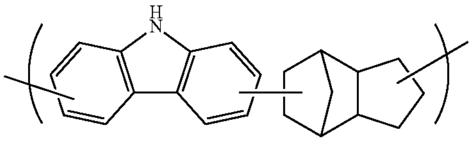

(C1-2-2-1)

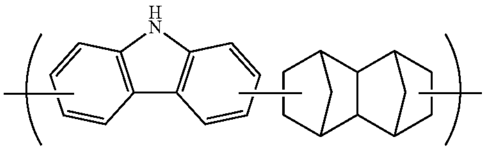

Specific examples of the unit represented by formulae (C1-3) include, but are not limited to, those described below.

[F12]

(C1-3-1-1)

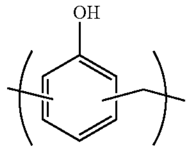

(C1-3-1-2)

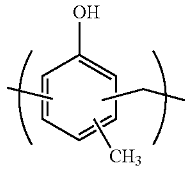

(C1-3-1-3)

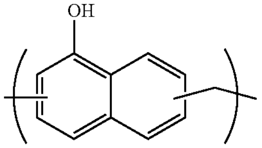

(C1-3-1-4)

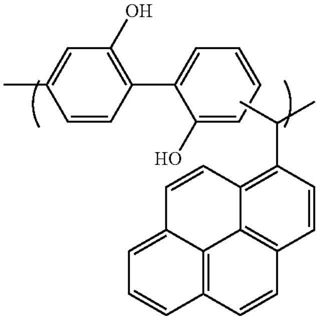

(C1-3-1-5)

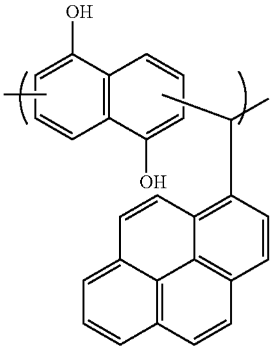

(C1-3-1-6)

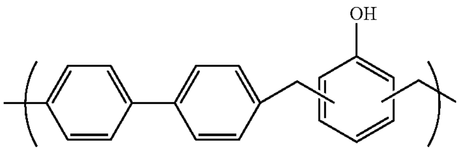

The novolak resin (i.e., the polymer used in the present invention) may be prepared through condensation between a carbazole compound and an aldehyde compound or a ketone compound.

Specific examples of the carbazole compound include, but are not limited to, carbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-yl-methyl)-9H-carbazole, 9-acetyl-3,6-diiodocarbazole, 9-benzoylcarbazole, 9-benzoylcarbazole-6-dicarboxaldehyde, 9-benzylcarbazole-3-carboxaldehyde, 9-methylcarbazole, 9-phenylcarbazole, 9-vinylcarbazole, carbazole potassium, carbazole-N-carbonyl chloride, N-ethylcarbazole-3-carboxaldehyde, and N-((9-ethylcarbazol-3-yl)methylene)-2-methyl-1-indolynylamine.

These carbazole compounds may be used singly or in combination of two or more species.

Specific examples of the aldehyde compound include, but are not limited to, saturated aliphatic aldehydes such as formaldehyde, paraformaldehyde, acetaldehyde, propylaldehyde, butylaldehyde, isobutylaldehyde, valeraldehyde, capronaldehyde, 2-methylbutylaldehyde, hexylaldehyde, undecanaldehyde, 7-methoxy-3,7-dimethyloctylaldehyde, cyclohexanaldehyde, 3-methyl-2-butylaldehyde, glyoxal, malonaldehyde, succinaldehyde, glutaraldehyde, and adipaldehyde; unsaturated aliphatic aldehydes such as acrolein and methacrolein; heterocyclic aldehydes such as furfural and pyridinaldehyde; and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino) benzaldehyde, and acetoxybenzaldehyde. Of these, aromatic aldehydes are preferred.

These aldehyde compounds may be used singly or in combination of two or more species.

Specific examples of the ketone compound include, but are not limited to, diaryl ketone compounds such as diphenyl ketone, phenyl naphthyl ketone, dinaphthyl ketone, phenyl tolyl ketone, and ditolyl ketone.

These ketone compounds may be used singly or in combination of two or more species.

In the condensation reaction for preparing the aforementioned polymer, an aldehyde compound or a ketone compound is generally used in an amount of 0.1 to 10 equivalents relative to 1 equivalent of the benzene rings forming the ring of a carbazole compound.

In the condensation reaction for preparing the aforementioned polymer, an acid catalyst is generally used.

Examples of the acid catalyst include, but are not limited to, mineral acids such as sulfuric acid, phosphoric acid, and perchloric acid; organic sulfonic acids such as p-toluenesulfonic acid and p-toluenesulfonic acid monohydrate; and carboxylic acids such as formic acid and oxalic acid.

The amount of the acid catalyst cannot be univocally determined, since the amount is appropriately tuned depending on, for example, the type of the acid used. Generally, the amount of the acid catalyst is appropriately determined to fall within a range of 0.001 to 10,000 parts by mass relative to 100 parts by mass of a carbazole compound.

The condensation reaction for preparing the aforementioned polymer may be performed without use of a solvent when the raw material compound or acid catalyst used is in the form of liquid. Generally, the condensation reaction is performed by use of a solvent.

No particular limitation is imposed on the solvent, so long as it does not inhibit the reaction. Typical examples of the solvent include ether compounds, for example, cyclic ether compounds such as tetrahydrofuran and dioxane.

Generally, the reaction temperature is appropriately determined to fall within a range of 40° C. to 200° C. The reaction time varies depending on the reaction temperature and thus cannot be univocally determined. Generally, the reaction time is appropriately determined to fall within a range of 30 minutes to 50 hours.

After completion of the reaction, the reaction product is optionally purified and isolated through any customary method, and the resultant novolak resin is used in preparation of a releasing agent composition.

Those skilled in the art can set the conditions for producing a novolac resin without undue burden based on the above description and common technical knowledge, and thus are able to produce a novolac resin.

The organic resin such as a novolak resin (i.e., polymer) generally has a weight-average molecular weight of 500 to 200,000. The weight-average molecular weight is preferably 100,000 or less, more preferably 50,000 or less, still more preferably 10,000 or less, much more preferably 5,000 or less, much more preferably 3,000 or less, from the viewpoints of, for example, securing the solubility of the resin in a solvent, and suitably mixing the resin with a branched-chain polysilane for forming a homogeneous film. The weight-average molecular weight is preferably 600 or more, more preferably 700 or more, still more preferably 800 or more, much more preferably 900 or more, much more preferably 1,000 or more, from the viewpoint of, for example, increasing the strength of the resultant film.

In the present invention, the weight-average molecular weight, number average molecular weight, and polydispersity of the organic resin such as a novolak resin (i.e., polymer) may be determined by means of, for example, a GPC apparatus (EcoSEC, HLC-8320GPC, products of Tosoh Corporation) and GPC columns (TSKgel SuperMultiporeHZ-N and TSKgel SuperMultiporeHZ-H, products of Tosoh Corporation) at a column temperature of 40° C. and a flow rate of 0.35 mL/min by use of tetrahydrofuran as an eluent (elution solvent) and polystyrene (product of Sigma-Aldrich) as a standard substance.

The resin contained in the releasing agent composition is preferably a novolak resin. Therefore, the releasing agent composition preferably contains a novolak resin alone as an organic resin. However, the releasing agent composition may contain an additional polymer together with a novolak resin, for the purpose of, for example, controlling film properties.

Examples of the additional polymer include a polyacrylic acid ester compound, a polymethacrylic acid ester compound, a polyacrylamide compound, a polymethacrylamide compound, a polyvinyl compound, a polystyrene compound, a polymaleimide compound, a polymaleic anhydride, and a polyacrylonitrile compound.

The aforementioned releasing agent composition may contain a cross-linking agent. By virtue of the presence of the cross-linking agent, cross-linking of resin molecules suitably proceeds, to thereby successfully attain suitable curing. As a result, there can be yielded, at high reproducibility, a film which cannot be suitably removed by an organic solvent, an acid, or a chemical liquid (e.g., an alkaline developer or hydrogen peroxide solution) usually employed in production of semiconductor elements, but can be suitably removed by a certain cleaning agent composition.

No particular limitation is imposed on the cross-linking agent, so long as it can cross-link with the aforementioned organic resin(s). Typical examples of the cross-linking agent include a phenolic cross-linking agent, a melamine cross-linking agent, a urea cross-linking agent, and a thiourea cross-linking agent, each of which contains, in the molecule thereof, a crosslink-forming group such as an alkoxymethyl group (e.g., hydroxymethyl, methoxymethyl, or butoxymethyl). Such a cross-linking agent may be a low-molecular-weight compound or a polymer compound.

The cross-linking agent contained in the releasing agent composition generally has two or more crosslink-forming groups. From the viewpoint of achieving more suitable curing at high reproducibility, the number of crosslink-forming groups contained in the compound serving as the cross-linking agent is preferably 2 to 10, more preferably 2 to 6.

From the viewpoint of achieving higher heat resistance, the cross-linking agent contained in the releasing agent composition preferably has an aromatic ring (e.g., benzene ring or naphthalene ring) in the molecule thereof. Typical examples of such a cross-linking agent include, but are not limited to, a phenolic cross-linking agent.

The phenolic cross-linking agent having a crosslink-forming group is a compound having a crosslink-forming group bonded to an aromatic ring and having at least one of a phenolic hydroxyl group and an alkoxy group derived from a phenolic hydroxyl group. Examples of the alkoxy group derived from a phenolic hydroxyl group include, but are not limited to, a methoxy group and a butoxy group.

The aromatic ring bonded to the crosslink-forming group or the aromatic ring bonded to a phenolic hydroxyl group and/or an alkoxy group derived from a phenolic hydroxyl group may be a non-condensed aromatic ring such as a benzene ring, or may be a condensed aromatic ring such as a naphthalene ring or an anthracene ring.

When the phenolic cross-linking agent has a plurality of aromatic rings in the molecule thereof, the crosslink-forming group, or a phenolic hydroxyl group and an alkoxy group derived from a phenolic hydroxyl group may be bonded to the same aromatic ring or different aromatic rings in the molecule of the phenolic cross-linking agent.

The aromatic ring bonded to the crosslink-forming group or a phenolic hydroxyl group and an alkoxy group derived from a phenolic hydroxyl group may be further substituted with, for example, an alkyl group (e.g., methyl, ethyl, or butyl), a hydrocarbon group such as an aryl group (e.g., phenyl), or a halogen atom (e.g., fluorine).

Specific examples of the phenolic cross-linking agent having a crosslink-forming group include compounds represented by any of formulae (L1) to (L4).

[F13]

(L1)

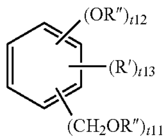

(L2)

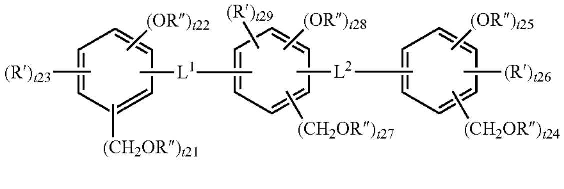

-continued (L3)

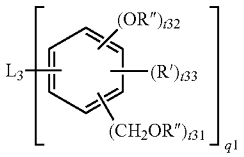

(L4)

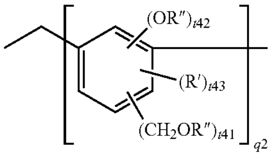

In the aforementioned formulae, R' independently represents a fluorine atom, an aryl group, or an alkyl group; R" independently represents a hydrogen atom or an alkyl group; each of $L^1$ and $L^2$ independently represents a single bond, a methylene group, or a propane-2,2-diyl group; $L^3$, which is determined depending on q1, represents a single bond, a methylene group, a propane-2,2-diyl group, a methanetriyl group, or an ethane-1,1,1-triyl group; t11, t12, and t13 are integers satisfying the following relations: 2 t11≤5, 1≤t12≤4, 0≤t13≤3, and t11+t12+t13≤6; t21, t22, and t23 are integers satisfying the following relations: 2≤t21≤4, 1≤t22≤3, 0≤t23≤2, and t21+t22+t23≤5; t24, t25, and t26 are integers satisfying the following relations: 2≤t24≤4, 1≤t25≤3, 0≤t26≤2, and t24+t25+t26≤5; t27, t28, and t29 are integers satisfying the following relations: 0≤t27≤4, 0≤t28≤4, 0≤t29≤4, and t24+t25+t26≤4; t31, t32, and t33 are integers satisfying the following relations: 2≤t31≤4, 1≤t32≤3, 0≤t33≤2, and t31+t32+t33≤5; t41, t42, and t43 are integers satisfying the following relations: 2≤t41≤3, 1≤t42≤2, 0≤t43≤1, and t41+t42+t43≤4; q1 is 2 or 3; and q2, which represents the number of repetitions, is an integer of 0 or more. Specific examples of the aforementioned aryl group and alkyl group are the same as those described below. The aryl group is preferably a phenyl group, and the alkyl group is preferably a methyl group or a t-butyl group.

Specific examples of the compounds represented by formulae (L1) to (L22), and formulae (L1M) to (L22M) include, but are not limited to, those described below. Such a compound may be synthesized through a known method, or may be obtained as a commercial product of, for example, ASAHI YUKIZAI CORPORATION or Honshu Chemical Industry Co., Ltd.

[F14]

(L1)

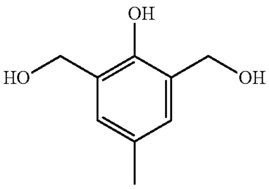

-continued (L2)

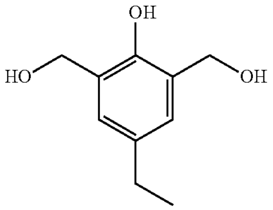

(L3)

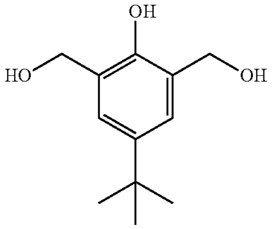

(L4)

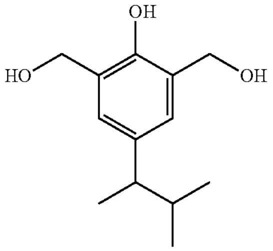

(L5)

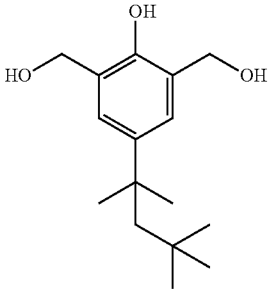

(L6)

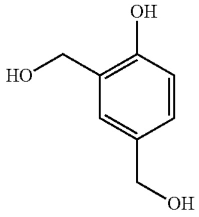

(L7)

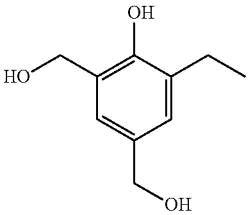

-continued
(L8)
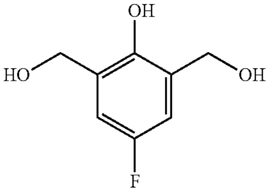
(L9)
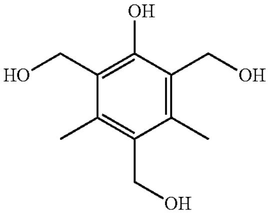
(L10)
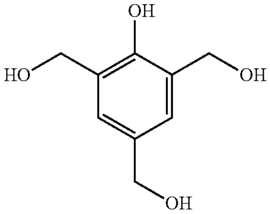
(L11)
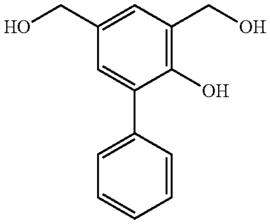
(L12)
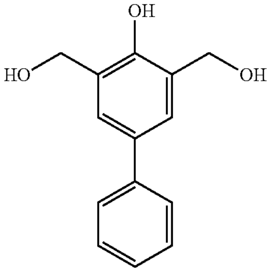
(L13)
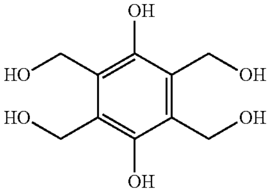
[F15]
(L1M)
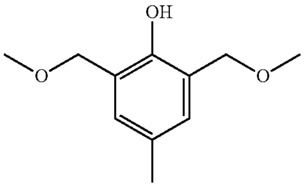
-continued
(L2M)
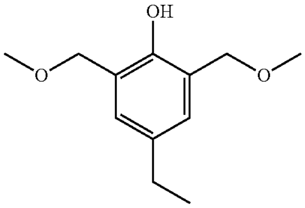
(L3M)
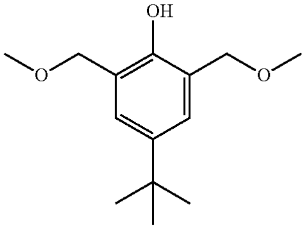
(L4M)
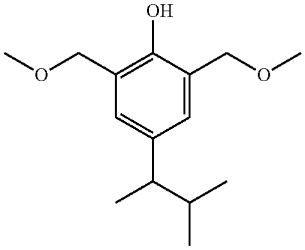
(L5M)
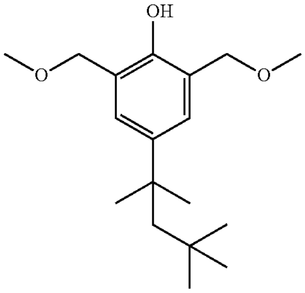
(L6M)
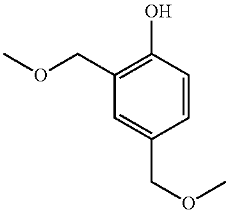
(L7M)
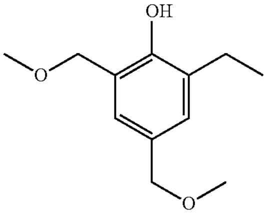

-continued
(L8M)
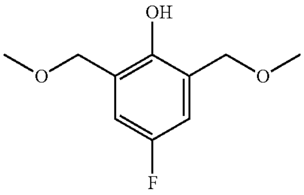
(L9M)
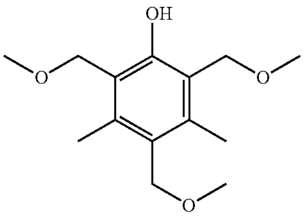
(L10M)
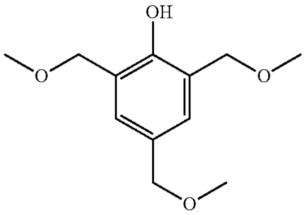
(L11M)
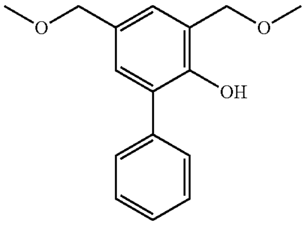
(L12M)
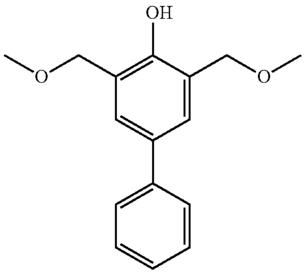
(L13M)
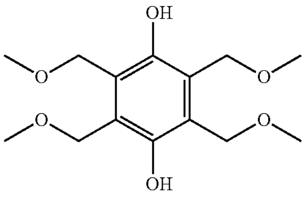
[F16]
(L14)
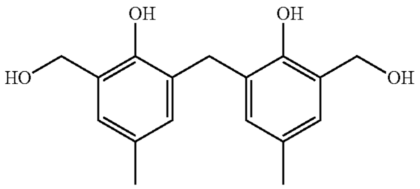
-continued
(L15)
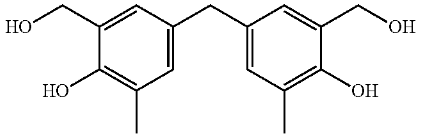
(L16)
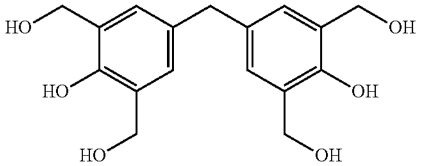
(L17)
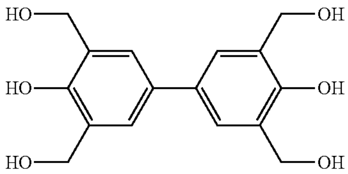
(L18)
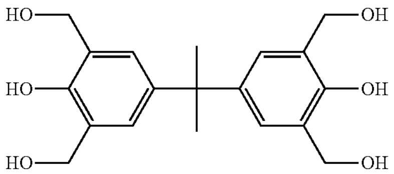
(L19)
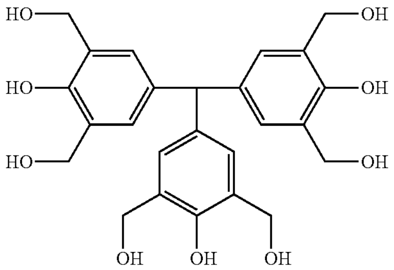
(L20)
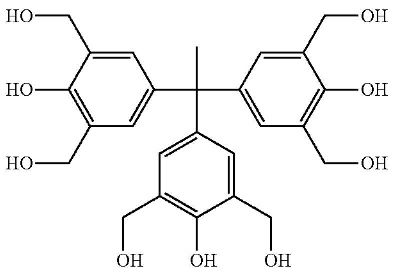
(L21)
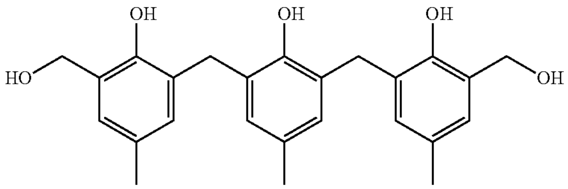
(L22)
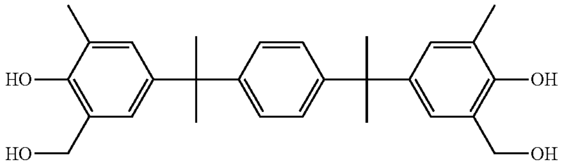

-continued

[F17]

(L14M)

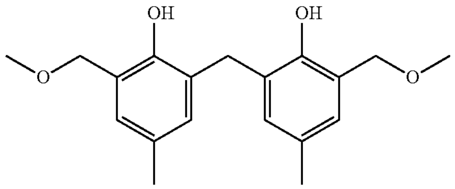

(L15M)

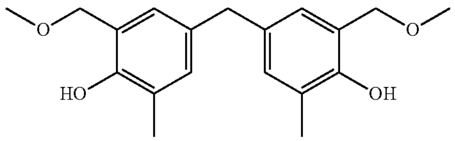

(L16M)

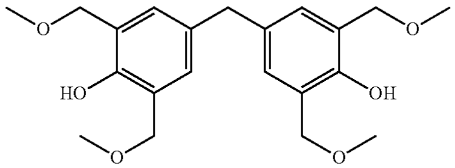

(L17M)

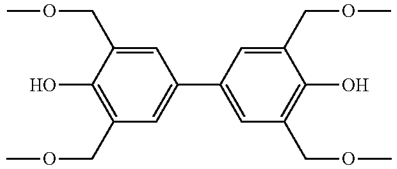

(L18M)

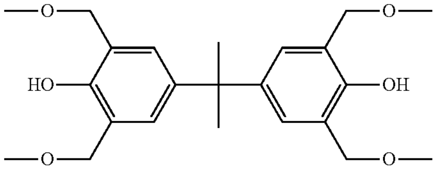

(L19M)

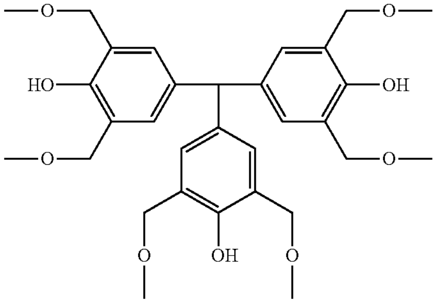

(L20M)

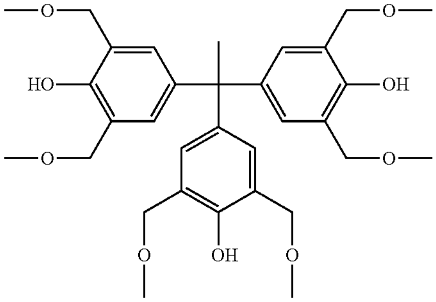

-continued (L21M)

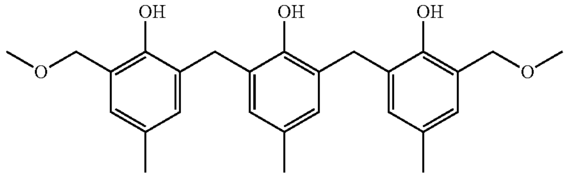

(L22M)

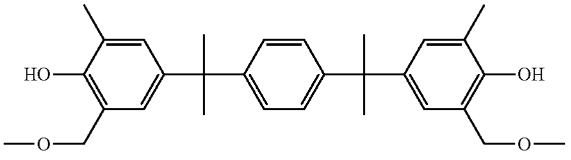

The melamine cross-linking agent having a crosslink-forming group is a melamine derivative, 2,4-diamino-1,3,5-triazine derivative, or 2-amino-1,3,5-triazine derivative wherein at least one hydrogen atom of an amino group bonded to the triazine ring is substituted with a crosslink-forming group. The triazine ring may further have a substituent such as an aryl group (e.g., phenyl).

Specific examples of the melamine cross-linking agent having a crosslink-forming group include, but are not limited to, mono-, bis-, tris-, tetrakis-, pentakis-, or hexakis-alkoxymethylmelamines, such as N,N,N',N',N",N"-hexakis (methoxymethyl)melamine and N,N,N',N',N",N"-hexakis (butoxymethyl)melamine; and mono-, bis-, tris-, or tetrakis-alkoxymethylbenzoguanamines, such as N,N,N',N'-tetrakis (methoxymethyl)benzoguanamine and N,N,N',N'-tetrakis (butoxymethyl)benzoguanamine.

The urea cross-linking agent having a crosslink-forming group is a urea-bond-containing compound derivative having a structure in which at least one hydrogen atom of the NH groups forming the urea bond is substituted with a crosslink-forming group.

Specific examples of the urea cross-linking agent having a crosslink-forming group include, but are not limited to, mono-, bis-, tris-, or tetrakis-alkoxymethylglycolurils, such as 1,3,4,6-tetrakis(methoxymethyl)glycoluril and 1,3,4,6-tetrakis(butoxymethyl)glycoluril; and mono-, bis-, tris-, or tetrakis-alkoxymethylureas, such as 1,3-bis(methoxymethyl)urea and 1,1,3,3-tetrakismethoxymethylurea.

The thiourea cross-linking agent having a crosslink-forming group is a thiourea-bond-containing compound derivative having a structure in which at least one hydrogen atom of the NH groups forming the thiourea bond is substituted with a crosslink-forming group.

Specific examples of the thiourea cross-linking agent having a crosslink-forming group include, but are not limited to, mono-, bis-, tris-, or tetrakis-alkoxymethylthiourea compounds, such as 1,3-bis(methoxymethyl)thiourea and 1,1,3,3-tetrakismethoxymethylthiourea.

The amount of the cross-linking agent contained in the releasing agent composition cannot unequivocally be determined, since the amount varies depending on, for example, the application method to be employed, or a desired film thickness. The amount of the cross-linking agent is generally 0.001 to 80 mass % relative to the film-forming components. From the viewpoints of achieving suitable curing and producing, at high reproducibility, a laminate from which a support substrate can be effectively debonded, the amount of the cross-linking agent is preferably 0.01 mass % or more, more preferably 0.05 mass % or more, still more preferably 0.5 mass % or more, much more preferably 1.0 mass % or more, and is preferably 50 mass % or less, more preferably 40 mass % or less, still more preferably 20 mass % or less, much more preferably 10 mass % or less.

The aforementioned releasing agent composition may further contains an acid-generator or an acid, for the purpose of acceleration of cross-liking reaction and the other reasons.

However, the aforementioned releasing agent composition generally does not contain an acid-generator or an acid, from the viewpoint of yielding a film suitable for producing a releasing layer at high reproducibility, which film cannot be completely removed by an organic solvent, an acid, or a chemical liquid (e.g., an alkaline developer or hydrogen peroxide solution) usually employed in production of semiconductor elements, but can be suitably removed by a particular cleaning agent composition.

Examples of the acid generator include a thermal acid generator and a photoacid generator.

No particular limitation is imposed on the thermal acid generator, so long as it generates an acid by heating. Specific examples of the thermal acid generator include, but are not limited to, 2,4,4,6-tetrabromocyclohexadienone, benzoin tosylate, 2-nitrobenzyl tosylate, K-PURE [registered trademark] CXC-1612, CXC-1614, TAG-2172, TAG-2179, TAG-2678, TAG-2689, and TAG-2700 (products of King Industries), SI-45, SI-60, SI-80, SI-100, SI-110, and SI-150 (products of SANSHIN CHEMICAL INDUSTRY CO., LTD.), and organic sulfonic acid alkyl esters.

Examples of the photoacid generator include an onium salt compound, a sulfonimide compound, and a disulfonyldiazomethane compound.

Specific examples of the onium salt compound include, but are not limited to, iodonium salt compounds, such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis (4-tert-butylphenyl)iodonium trifluoromethanesulfonate; and sulfonium salt compounds, such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Specific examples of the sulfonimide compound include, but are not limited to, N-(trifluoromethanesulfonyloxy)succinimide, N-(nonafluoro-normal-butanesulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Specific examples of the acid include, but are not limited to, arylsulfonic acids and salts thereof (e.g., pyridinium salts), such as p-toluenesulfonic acid, pyridinium sulfosalicylic acid, 4-phenolsulfonic acid, 4-chlorobenzenesulfonic acid, benzenesulfonic acid, and 1-naphthalenesulfonic acid; arylcarboxylic acids and salts thereof, such as salicylic acid, benzoic acid, hydroxybenzoic acid, and naphthalenecarboxylic acid; chain or cyclic alkylsulfonic acids and salts thereof, such as trifluoromethanesulfonic acid and camphorsulfonic acid; and chain or cyclic alkylcarboxylic acids and salts thereof, such as citric acid.

The amount of the acid generator or acid contained in the releasing agent composition cannot unequivocally be determined, since the amount varies depending on, for example, the type of the cross-linking agent to be used, or the temperature of heating in formation of film. The amount of the acid generator or the acid is generally 0.01 to 5 mass % with respect to the film-forming components.

The aforementioned releasing agent composition may contain a surfactant, for the purpose of, for example, controlling the properties of the composition itself or the properties of the resultant film, and preparing a highly homogeneous releasing agent composition at high reproducibility.

Examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants such as EFTOP EF301, EF303, and EF352 (trade names, products of Tohkem Products Corporation), MEGAFAC F171, F173, R-30, and R-30N (trade names, products of DIC Corporation), Fluorad FC430 and FC431 (trade names, products of Sumitomo 3M Limited), Asahi Guard AG710, and SURFLON S-382, SC101, SC102, SC103, SC104, SC105, and SC106 (trade names, products of Asahi Glass Co., Ltd.); and Organosiloxane Polymer KP341 (available from Shin-Etsu Chemical Co., Ltd.).

These surfactants may be used singly or in combination of two or more species.

The amount of the surfactant is generally 2 mass % or less relative to that of the film-forming component(s) of the releasing agent composition.

The aforementioned releasing agent composition contains a branched-chain polysilane.

The branched-chain polysilane has an Si—Si bond and a branch structure. Since the releasing agent composition contains a branched-chain polysilane, the release layer formed of the resultant film cannot be suitably removed by any of an organic solvent, an acid, and a chemical liquid (e.g., an alkaline developer or hydrogen peroxide solution) used for the production of semiconductor elements, but the release layer can be suitably removed by use of a cleaning agent composition. Therefore, when the semiconductor substrate is separated from the support substrate in the laminate of the present invention, and then each of the substrates is cleaned by use of the cleaning agent composition, the residue of the release layer on the substrate can be suitably removed. The reason for this is not clear, but is considered as follows. A polysilane can be cross-linked with an organic resin depending on the type of the terminal group (terminal substituent (atom)) of the polysilane. Since a branched-chain polysilane has more terminal groups (terminal substituents (atoms)) than a linear-chain polysilane, the branched-chain polysilane is considered to have more cross-linking points than the linear-chain polysilane. Appropriate and suitable curing via many such cross-linking points in the branched-chain polysilane can provide the property that the release layer is not suitably removed by any of an organic solvent, an acid, and a chemical liquid (e.g., an alkaline developer or hydrogen peroxide solution) used for the production of semiconductor elements, as well as the property that the release layer is suitably removed by use of the cleaning agent composition.

The branched-chain polysilane preferably contains a structural unit represented by formula (B).

[F18]

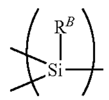
(B)

$R^B$ represents a hydrogen atom, a hydroxyl group, a silyl group, or an organic group. Specific examples of the organic group include hydrocarbon groups (optionally substituted alkyl groups, optionally substituted alkenyl groups, optionally substituted aryl groups, and optionally substituted aralkyl groups) and ether groups corresponding to these hydrocarbon groups (e.g., optionally substituted alkoxy groups, optionally substituted aryloxy groups, and optionally substituted aralkyloxy groups). In many cases, the organic group is generally a hydrocarbon group such as an alkyl group, an alkenyl group, an aryl group, or an aralkyl group. In many cases, a hydrogen atom, a hydroxyl group, an alkoxy group, or a silyl group is substituted at the terminal.

The optionally substituted alkyl group may be linear-chain, branched-chain, or cyclic.

Specific examples of the optionally substituted linear-chain or branched-chain alkyl group include, but are not limited to, methyl, ethyl, n-propyl, i-propyl, n-butyl, i-butyl, s-butyl, tert-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl. The number of carbon atoms of the optionally substituted linear-chain or branched-chain alkyl group is generally 1 to 14, preferably 1 to 10, more preferably 1 to 6.

Specific examples of the optionally substituted cycloalkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl. The number of carbon atoms of the optionally substituted cycloalkyl group is generally 3 to 14, preferably 4 to 10, more preferably 5 or 6.

The alkenyl group may be linear-chain, branched-chain, or cyclic.

Specific examples of the optionally substituted linear-chain or branched-chain alkenyl group include, but are not limited to, vinyl, allyl, butenyl, and pentenyl. The number of carbon atoms of the optionally substituted linear-chain or branched-chain alkenyl group is generally 2 to 14, preferably 2 to 10, more preferably 1 to 6.

Specific examples of the optionally substituted cycloalkenyl group include, but are not limited to, cyclopentenyl and cyclohexenyl. The number of carbon atoms of the optionally substituted cycloalkenyl group is generally 4 to 14, preferably 5 to 10, more preferably 5 or 6.

Specific examples of the optionally substituted aryl group include, but are not limited to, phenyl, 4-methylphenyl, 3-methylphenyl, 2-methylphenyl, 3,5-dimethylphenyl, 1-naphtly, and 2-naphtyl. The number of carbon atoms of the optionally substituted aryl group is generally 6 to 20, preferably 6 to 14, more preferably 6 to 12.

Specific examples of the optionally substituted aralkyl group include, but are not limited to, benzyl, phenethyl, and phenylpropyl. The optionally substituted aralkyl group is preferably a group formed by substituting one hydrogen atom of a C1 to C4 alkyl group with a C6 to C20 aryl group.

The alkyl moiety of the optionally substituted alkoxy group may be linear-chain, branched-chain, or cyclic.

Specific examples of the optionally substituted linear-chain or branched-chain alkoxy group include, but are not limited to, methoxy, ethoxy, propoxy, isopropoxy, butoxy, t-butoxy, and pentyloxy. The number of carbon atoms of the optionally substituted linear-chain or branched-chain alkoxy group is generally 1 to 14, preferably 1 to 10, more preferably 1 to 6.

Specific examples of the optionally substituted cycloalkoxy group include, but are not limited to, cyclopentyloxy and cyclohexyloxy. The number of carbon atoms of the optionally substituted cycloalkoxy group is generally 3 to 14, preferably 4 to 10, more preferably 5 or 6.

Specific examples of the optionally substituted aryloxy group include, but are not limited to, phenoxy, 1-naphtyloxy, and 2-naphthyloxy. The number of carbon atoms of the optionally substituted aryloxy group is generally 6 to 20, preferably 6 to 14, more preferably 6 to 10.

Specific examples of the optionally substituted aralkyloxy group include, but are not limited to, benzyloxy, phenethyloxy, and phenylpropyloxy. The optionally substituted aralkyloxy group is preferably a group formed by substituting one hydrogen atom of a C1 to C4 alkyloxy group with a C6 to C20 aryl group.

Specific examples of the silyl group include, but are not limited to, silyl, disilanyl, and trisilanyl. The number of silicon atoms of the silyl group is generally 1 to 10, preferably 1 to 6.

When $R^B$ is the aforementioned organic group or a silyl group, at least one hydrogen atom thereof may be substituted with a substituent. Specific examples of such substituents include a hydroxyl group, an alkyl group, an aryl group, and an alkoxy group.

$R^B$ is preferably an alkyl group or an aryl group, more preferably an aryl group, still more preferably a phenyl group, a 1-naphthyl group, or a 2-naphthyl group, much more preferably a phenyl group, from the viewpoints of, for example, preventing unintentional debonding when the laminate of the present invention is brought into contact with any of an organic solvent, an acid, and a chemical liquid (e.g., an alkaline developer or hydrogen peroxide solution) used in production of semiconductor elements, and suitably removing the residue of the release layer on the substrate, during separation of the semiconductor substrate from the support substrate of the laminate of the present invention, and then cleaning of each substrate by use of the cleaning agent composition.

The branched-chain polysilane used in the present invention may include, besides the structural unit represented by formula (B), a structural unit represented by formula (S) or a structural unit represented by formula (N). The amount of the structural unit represented by formula (B) included in the branched-chain polysilane is generally 50 mol % or more, preferably 60 mol % or more, more preferably 70 mol % or more, still more preferably 80 mol % or more, much more preferably 90% or more, much more preferably 95 mol % or more in the entire structural units, from the viewpoints of, for example, preventing unintentional debonding when the laminate of the present invention is brought into contact with any of an organic solvent, an acid, and a chemical liquid (e.g., an alkaline developer or hydrogen peroxide solution) used in production of semiconductor elements, and suitably removing the residue of the release layer on the substrate, during separation of the semiconductor substrate from the support substrate in the laminate of the present invention, and then cleaning of each substrate by use of the cleaning agent composition.

[F19]

(S)

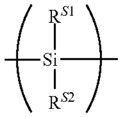

(N)

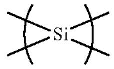

($R^{S1}$ and $R^{S2}$ have the same meanings as defined in $R^B$.)

Generally, the terminal group (terminal substituent (atom)) of the branched-chain polysilane may be, for example, a hydrogen atom, a hydroxyl group, a halogen atom (e.g., chlorine atom), an alkyl group, an aryl group, an alkoxy group, or a silyl group. In many cases, the terminal group is a hydroxyl group, a methyl group, or a phenyl group. Of these, a methyl group is preferred. The terminal group may be a trimethylsilyl group.

In a certain embodiment, the average polymerization degree of the branched-chain polysilane is generally 2 to 100, preferably 3 to 80, more preferably 5 to 50, still more preferably 10 to 30 in terms of silicon atom (i.e., average number of silicon atoms per molecule).

In a certain embodiment, the upper limit of the weight-average molecular weight of the branched-chain polysilane is generally 30,000, preferably 20,000, more preferably 10,000, still more preferably 5,000, much more preferably 2,000, much more preferably 1,500, and the lower limit of the weight-average molecular weight is generally 50, preferably 100, more preferably 150, still more preferably 200, much more preferably 300, much more preferably 500.

The average polymerization degree and weight-average molecular weight of the polysilane used in the present invention may be determined by means of, for example, a GPC apparatus (EcoSEC, HLC-8220GPC, products of Tosoh Corporation) and GPC columns (Shodex KF-803L, KF-802, and KF-801 (used in this order), products of Showa Denko K.K.) at a column temperature of 40° C. and a flow rate of 1.00 mL/min by use of tetrahydrofuran as an eluent (elution solvent) and polystyrene (product of Sigma-Aldrich) as a standard substance.

When the polymerization degree and weight-average molecular weight of the employed branched-chain polysilane are excessively low, vaporization of the polysilane occurs through heating during formation of the film (i.e., release layer), processing of the laminate including the resultant release layer, or the like, or problems are evoked by insufficient strength of the film. When the polymerization degree and molecular weight of the employed branched-chain polysilane are excessively high, sufficient solubility of the polymer may fail to secured in a certain type of a solvent used for preparing the releasing agent composition, resulting in precipitation in the composition, or mixing of the polymer with the resin is poorly conducted, resulting in failure to form a highly homogeneous film at high reproducibility.

Therefore, the polymerization degree and weight-average molecular weight of the branched-chain polysilane preferably fall within the aforementioned ranges, from the viewpoint of providing, at higher reproducibility, a laminate including a release layer contributing to suitable production of semiconductor elements.

The 5% weight loss temperature of the branched-chain polysilane used in the present invention is generally 300° C. or higher, preferably 350° C. or higher, more preferably 365° C. or higher, still more preferably 380° C. or higher, much more preferably 395° C. or higher, much more preferably 400° C. or higher, from the viewpoint of forming a release layer having excellent heat resistance at high reproducibility.

The 5% weight loss temperature of the polysilane used in the present invention may be determined by means of, for example, 2010SR (product of NETZSCH) in air with an increase in temperature from ambient temperature (25° C.) to 400° C. at 10° C./min.

Preferably, the branched-chain polysilane used in the present invention can be dissolved in any of an ether compound such as tetrahydrofuran, an aromatic compound such as toluene, a glycol ether ester compound such as propylene glycol monomethyl ether acetate, a ketone compound such as cyclohexanone or methyl ethyl ketone, and a glycol ether compound such as propylene glycol monomethyl ether, from the viewpoints of, for example, suitably removing the residue of the release layer on the substrate, when the semiconductor substrate is separated from the support substrate in the laminate of the present invention, and then each of the substrates is cleaned by use of the cleaning agent composition, and preparing a highly homogeneous releasing agent composition at high reproducibility. The term "dissolution" as used herein refers to the case where dissolution of the polysilane in a solvent can be visually confirmed within one hour, when the polysilane is attempted to be dissolved in the solvent by means of a shaker at ambient temperature (25° C.) so as to prepare a 10 mass % solution.

The branched-chain polysilane may be in the form of solid or liquid at ambient temperature.

The branched-chain polysilane used in the present invention may be produced according to any known method disclosed in, for example, Japanese Patent Application Laid-Open (kokai) Nos. 2011-208054, 2007-106894, and 2007-145879, and WO2005/113648. Alternatively, the branched-chain polysilane may be a commercially available product.

Specific examples of the commercially available product include, but are not limited to, silicon-containing material Polysilane OGSOL SI-20-10 and SI-20-14 (products of Osaka Gas Chemicals Co., Ltd.).

Examples of preferred branched-chain polysilanes include, but are not limited to, those described below.

[F20]

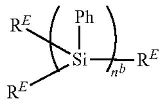

(B-1)

(Ph represents a phenyl group; $R^E$ represents a terminal substituent (atom or group); and $n^b$ represents the number of repeating units.)

The amount of the branched-chain polysilane contained in the aforementioned releasing agent composition is generally 10 to 90 mass % relative to that of the film-forming component(s) of the composition. The amount of the branched-chain polysilane is preferably 15 to 80 mass %, more preferably 20 to 70 mass %, still more preferably 25 to 60 mass %, much more preferably 30 to 50 mass %, from the viewpoint of, for example, realizing, at high reproducibility, a film that cannot be suitably removed by an organic solvent, an acid, or a chemical liquid (e.g., an alkaline developer or hydrogen peroxide solution) used for the production of semiconductor elements, but can be suitably removed by use of the cleaning agent composition.

The aforementioned releasing agent composition contains a solvent.

Such a solvent may be, for example, a high-polarity solvent that can suitably dissolve film-forming components such as an organic resin and a branched-chain polysilane. If necessarily, a low-polarity solvent may also be used for the purpose of, for example, adjustment of viscosity or surface tension. In the present invention, the "low-polarity solvent" is defined as a solvent exhibiting a dielectric constant less than 7 at a frequency of 100 kHz, and the "high-polarity solvent" is defined as a solvent exhibiting a dielectric constant of 7 or more at a frequency of 100 kHz. Such solvents may be used singly or in combination of two or more species.

Examples of the high-polarity solvent include:

amide solvents, such as N,N-dimethylformamide, N,N-dimethylacetamide, N,N-dimethylisobutylamide, N-methylpyrrolidone, and 1,3-dimethyl-2-imidazolidinone; ketone solvents, such as ethyl methyl ketone, isophorone, and cyclohexanone; cyano solvents, such as acetonitrile and 3-methoxypropionitrile; polyhydric alcohol solvents, such as ethylene glycol, diethylene glycol, triethylene glycol, dipropylene glycol, 1,3-butanediol, and 2,3-butanediol;

monohydric alcohol solvents other than aliphatic alcohols, such as propylene glycol monomethyl ether, diethylene glycol monomethyl ether, diethylene glycol momophenyl ether, triethylene glycol monomethyl ether, dipropylene glycol monomethyl ether, benzyl alcohol, 2-phenoxyethanol, 2-benzyloxyethanol, 3-phenoxybenzyl alcohol, and tetrahydrofurfuryl alcohol; and sulfoxide solvents, such as dimethyl sulfoxide.

Examples of the low-polarity solvent include chlorine-containing solvents such as chloroform and chlorobenzene; aromatic hydrocarbon solvents such as alkylbezenes, for example, toluene, xylene, tetraline, cyclohexylbenzene, and decylbenzene; aliphatic alcohol solvents such as 1-octanol, 1-nonanol, and 1-decanol; ether solvents such as tetrahydrofuran, dioxane, anisole, 4-methoxytoluene, 3-phenoxytoluene, dibenzyl ether, diethylene glycol dimethyl ether, diethylene glycol butyl methyl ether, triethylene glycol dimethyl ether, and triethylene glycol butyl methyl ether; and ester solvents such as methyl benzoate, ethyl benzoate, butyl benzoate, isoamyl benzoate, bis(2-ethylhexyl) phthalate, dibutyl maleate, dibutyl oxalate, hexyl acetate, propylene glycol monomethyl ether acetate, diethylene glycol monoethyl ether acetate, and diethylene glycol monobutyl ether acetate.

The solvent content of the composition is appropriately modified in consideration of, for example, a desired viscosity of the composition, the application method to be employed, and the thickness of a thin film to be formed. The solvent content is 99 mass % or less with respect to the entire composition, preferably 70 to 99 mass % or less with respect to the entire composition. That is, the amount of film-forming component(s) is 1 to 30 mass %, with respect to the entire composition. As used herein, the term "film-forming component" refers to a component contained in the composition other the solvent.

The viscosity and surface tension of the releasing agent composition are appropriately adjusted by modifying the type of the organic solvent(s) used, the compositional proportions of the organic solvents, and the film-forming component concentration, etc., in consideration of various factors such as the application method to be employed, and a desired film thickness.

In a certain embodiment of the present invention, the releasing agent composition contains a glycol solvent, from the viewpoints of, for example, providing a composition having high homogeneity at high reproducibility, providing a composition having high storage stability at high reproducibility, and providing a composition that forms a highly homogeneous thin film at high reproducibility. As used herein, the term "glycol solvent" collectively refers to glycols, glycol monoethers, glycol diethers, glycol monoesters, glycol diesters, and glycol ester ethers.

An example of a preferred glycol solvent is represented by formula (G).

[F21]

$$R^{G2}-O-\left[R^{G1}-O\right]_{n^g}R^{G3} \quad (G)$$

In formula (G), $R^{G1}$ independently represents a C2 to C4 linear-chain or branched-chain alkylene group; each of $R^{G2}$ and $R^{G3}$ independently represents a hydrogen atom, a linear-chain or branched-chain C1 to C8 alkyl group, or an alkylacyl group wherein the alkyl moiety is a C1 to C8 linear-chain or branched-chain alkyl group; and $n^g$ represents an integer of 1 to 6.

Specific examples of the C2 to C4 linear-chain or branched-chain alkylene group include, but are not limited to, ethylene, trimethylene, 1-methylethylene, tetramethylene, 2-methylpropane-1,3-diyl, pentamethylene, and hexamethylene.

Among them, the C2 to C4 linear-chain or branched-chain alkylene group is preferably a C2 to C3 linear-chain or branched-chain alkylene group, more preferably a C3 linear-chain or branched-chain alkylene group, from the viewpoints of, for example, providing a composition having high homogeneity at high reproducibility, providing a composition having high storage stability at high reproducibility, and providing a composition that forms a highly homogeneous thin film at high reproducibility.

Specific examples of the linear-chain or branched-chain C1 to C8 alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl and ethyl are preferred, with methyl being more preferred, from the viewpoints of providing a highly uniform composition at high reproducibility, providing a composition having high storage stability at high reproducibility, providing a composition which can form a highly uniform film at high reproducibility, etc.

In the alkylacyl group in which the alkyl moiety is a C1 to C8 linear-chain or branched-chain alkyl group, specific examples of the C1 to C8 linear-chain or branched-chain alkyl group are the same as those described above.

Among them, a methylcarbonyl group or an ethylcarbonyl group is preferred, with a methylcarbonyl group being more preferred, from the viewpoints of, for example, providing a composition having high homogeneity at high reproducibility, providing a composition having high storage stability at high reproducibility, and providing a composition that forms a highly homogeneous thin film at high reproducibility.

In formula (G), $n^g$ is preferably 4 or less, more preferably 3 or less, still more preferably 2 or less, most preferably 1, from the viewpoints of, for example, providing a composition having high homogeneity at high reproducibility, providing a composition having high storage stability at high reproducibility, and providing a composition that forms a highly homogeneous thin film at high reproducibility.

In formula (G), preferably, at least one of $R^{G2}$ and $R^{G3}$ is a linear-chain or branched-chain C1 to C8 alkyl group, and more preferably, one of $R^{G2}$ and $R^{G3}$ is a linear-chain or branched-chain C1 to C8 alkyl group, and the other is a hydrogen atom or an alkylacyl group wherein the alkyl moiety is a C1 to C8 linear-chain or branched-chain alkyl group, from the viewpoints of, for example, providing a composition having high homogeneity at high reproducibility, providing a composition having high storage stability at high reproducibility, and providing a composition that forms a highly homogeneous thin film at high reproducibility.

The amount of the glycol solvent is preferably 50 mass % or more, more preferably 70 mass % or more, still more preferably 80 mass % or more, yet more preferably 90 mass % or more, much more preferably 95 mass % or more, relative to the entire solvent contained in the releasing agent composition, from the viewpoints of, for example, providing a composition having high homogeneity at high reproducibility, providing a composition having high storage stability at high reproducibility, and providing a composition that forms a highly homogeneous thin film at high reproducibility.

In the releasing agent composition, the film-forming components are homogeneously dispersed or dissolved (preferably, dissolved) in the solvent, from the viewpoints of, for example, providing a composition having high homogeneity at high reproducibility, providing a composition having high storage stability at high reproducibility, and providing a composition that forms a highly homogeneous thin film at high reproducibility.

The aforementioned releasing agent composition may be produced by mixing an organic resin, a branched-chain polysilane, and a solvent.

No particular limitation is imposed on the sequential order of mixing of these components. In one non-limitative example of the method which can produce the releasing agent composition, an organic resin and a branched-chain polysilane are dissolved in a solvent at one time. In another non-limitative mode, a portion of a mixture of the organic resin and the branched-chain polysilane is dissolved in a solvent, the remaining portion of the mixture is dissolved in another solvent, and the resultant solutions are mixed together. Notably, a reaction mixture as is (or a concentrate or dilute thereof) obtained in the synthesis of the organic resin may be used as an organic resin solution. Also, the releasing agent composition may be appropriately heated in the preparation thereof, so long as the components of the composition are not decomposed or denatured.

In the present invention, the solvent, solution, etc. used in relation to the production of the releasing agent composition may be filtered for the purpose of removing foreign matter by means of, for example, a sub-micrometer filter in the course of producing the composition or after mixing of all the components.

The release layer included in the laminate of the present invention generally has a thickness of 5 nm to 100 μm. In a certain embodiment, the thickness is 10 nm to 1 μm, and in another embodiment, the thickness is 50 nm to 500 nm.

The present invention is also directed to the above-described releasing agent composition, and conditions (e.g., suitable conditions or production conditions) in relation to the composition are as described above. The releasing agent composition of the present invention can provide, at high reproducibility, a film suitably serving as a release layer that can be used in production of, for example, a semiconductor device.

Particularly, the releasing agent composition of the present invention can be suitably used for forming a release layer of a laminate which includes a semiconductor substrate, a support substrate, an adhesive layer disposed between the semiconductor substrate and the support substrate so as to come into contact with the semiconductor substrate, and a release layer disposed so as to come into contact with the support substrate and the adhesive layer. In the case where the support substrate of such a laminate has light transparency, when the release layer of such a laminate is irradiated with light from the support substrate side, separation or decomposition of the release layer suitably proceeds as described above. As a result, the semiconductor substrate can be separated from the support substrate, without applying a further excessive load for debonding. In addition, through cleaning the separated semiconductor substrate with a cleaning agent composition, the substrate can be suitably cleaned without leaving the residue of the release layer on the substrate.

One characteristic feature of the release layer obtained from the releasing agent composition of the present invention resides in that the layer cannot be completely removed by an organic solvent, an acid, or a chemical liquid (e.g., an alkaline developer or hydrogen peroxide solution) usually employed in production of semiconductor elements, but can be suitably removed by a particular cleaning agent composition. Such specific and selective removability is attributable to the branched-chain polysilane contained in the releasing agent composition of the present invention. The branched-chain polysilane can serve as an agent which can enhance solubility and removability of the release layer with respect to the cleaning agent composition. Also, the branched-chain polysilane can serve as an agent which can reduce solubility and removability of the release layer with respect to an organic solvent, an acid, or a chemical liquid (e.g., an alkaline developer or aqueous hydrogen peroxide solution) usually employed in production of semiconductor elements.

As described above, the release layer formed from the releasing agent composition of the present invention cannot be suitably removed by an organic solvent, an acid, or a chemical liquid (e.g., an alkaline developer or hydrogen peroxide solution) used in production of semiconductor elements.

Specific examples of the organic solvent include linear-chain or branched-chain aliphatic hydrocarbons, for example, linear-chain or branched-chain saturated aliphatic hydrocarbons such as hexane, heptane, octane, nonane, decane, undecane, dodecane, and isododecane; alicyclic hydrocarbons, for example, saturated alicyclic hydrocarbons such as cyclohexane, cycloheptane, cyclooctane, isopropylcyclohexane, and p-menthane, and unsaturated alicyclic hydrocarbons such as limonene; aromatic hydrocarbons such as benzene, toluene, o-xylene, m-xylene, p-xylene, mesitylene, 1,2,4-trimethylbenzene, cumene, 1,4-diisopropylbenzene, and p-cymene; ketones, for example, saturated aliphatic hydrocarbon ketones, such as dialkyl ketones such as MIBK (methyl isobutyl ketone), ethyl methyl ketone, acetone, diisobutyl ketone, 2-octanone, 2-nonanone, and 5-nonanon, and cycloalkyl ketones such as cyclohexanone, and unsaturated aliphatic hydrocarbon ketones, such as alkenyl ketones such as isophorone; ethers, for example, dialkyl ethers such as diethyl ether, di(n-propyl) ether, di(n-butyl) ether, and di(n-pentyl) ether, and cyclic alkyl ethers such as tetrahydrofuran and dioxane; sulfides, for example, dialkyl sulfides such as diethyl sulfide, di(n-propyl) sulfide, and di(n-butyl) sulfide; amides such as N,N-dimethylformamide, N,N-dimethylacetamide, N,N-dimethylisobutylamide, N-methylpyrrolidone, and 1,3-dimethyl-2-imidazolidinone; nitriles such as acetonitrile and 3-methoxypropionitrile; polyhydric alcohols such as ethylene glycol, diethylene glycol, triethylene glycol, dipropylene glycol, 1,3-butanediol, and 2,3-butanediol; glycol monohydrocarbon ethers, for example, glycol monoalkyl ethers such as propylene glycol monomethyl ether, diethylene glycol monomethyl ether, triethylene glycol monomethyl ether, and dipropylene glycol monomethyl ether, and glycol monoaryl ethers such as diethylene glycol monophenyl ether; alkyl alcohols, for example, linear-chain or branched-chain alkyl monoalcohols such as methanol, ethanol, and propanol, and cyclic alkyl alcohols such as cyclohexanol, and monoalcohols other than alkyl alcohols such as diacetone alcohol, benzyl alcohol, 2-phenoxyethanol, 2-benzyloxyethanol, 3-phenoxybenzyl alcohol, and tetrahydrofurfuryl alcohol; glycols such as ethylene glycol, propylene glycol, diethylene glycol, dipropylene glycol, tripropylene glycol, hexylene glycol, triethylene glycol, 1,2-butanediol, 2,3-butanediol, 1,3-butanediol, 1,4-butanediol, and 1,5-pentanediol; glycol monoethers, for example, glycol monoalkyl ethers such as ethylene glycol monohexyl ether, propylene glycol monobutyl ether, diethylene glycol monoethyl ether, dipropylene glycol monobutyl ether, ethylene glycol monobutyl ether, diethylene glycol monobutyl ether, diethylene glycol monoisobutyl ether, dipropylene glycol monomethyl ether, diethylene glycol monopropyl ether (propyl carbitol), diethylene glycol monohexyl ether, 2-ethylhexyl carbitol, dipropylene glycol monopropyl ether, tripropylene glycol monomethyl ether, diethylene glycol monomethyl ether, and tripropylene glycol monobutyl ether, and glycol monoaryl ethers such as 2-phenoxyethanol; glycol diethers, for example, glycol dialkyl ethers such as ethylene glycol dibutyl ether, diethylene glycol dimethyl ether, diethylene glycol diethyl ether, propylene glycol dibutyl ether, dipropylene glycol methyl n-propyl ether, dipropylene glycol dimethyl ether, dipropylene glycol diethyl ether, dipropylene glycol dibutyl ether, triethylene glycol dimethyl ether, triethylene glycol butyl methyl ether, and tetraethylene glycol dimethyl ether; glycol ether acetates, for example, glycol monoalkyl ether acetates such as dipropylene glycol monomethyl ether acetate, diethylene glycol monoethyl ether acetate, diethylene glycol monobutyl ether acetate, and propylene glycol monomethyl ether acetate; cyclic carbonates such as ethylene carbonate, propylene carbonate, and vinylene carbonate; and esters such as butyl acetate and pentyl acetate.

Examples of the acid include, but are not limited to, mineral acids such as phosphoric acid, hydrochloric acid, perchloric acid, nitric acid, and sulfuric acid, and salts thereof; arylsulfonic acids and salts thereof (e.g., pyridinium salts) such as p-toluenesulfonic acid, pyridinium sulfosalicylic acid, 4-phenolsulfonic acid, 4-chlorobenzenesulfonic acid, benzenedisulfonic acid, and 1-naphthalenesulfonic acid; arylcarboxylic acids such as salicylic acid, benzoic acid, hydroxybenzoic acid, and naphthalenecarboxylic acid, and salts thereof; chain or cyclic alkylsulfonic acids such as trifluoromethanesulfonic acid and camphorsulfonic acid, and salts thereof; and chain or cyclic alkylcarboxylic acids such as citric acid, and salts thereof.

Examples of the alkaline developer include, but are not limited to, alkaline aqueous solutions, for example, aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine.

The property that the release layer formed from the releasing agent composition of the present invention is not suitably removed by an organic solvent, an acid, or a chemical liquid (e.g., an alkaline developer or hydrogen peroxide solution) used in production of semiconductor elements can be assessed through the procedure as described below.

Specifically, a silicon wafer (4 cm×4 cm) and a film (thickness: 200 nm) formed on the wafer are immersed in 7 mL of a liquid for evaluation, and the thickness of the film is measured before and after the immersion, to thereby calculate a percent reduction in film thickness (hereinafter may be referred as "percent film thickness reduction") (%); i.e., the film thickness after the immersion with respect to that before the immersion. The aforementioned property may be assessed by the percent film thickness reduction.

The release layer formed from the releasing agent composition of the present invention exhibits a low percent film thickness reduction as determined through this method, even after being immersed in an organic solvent, an acid, or a chemical liquid (e.g., an alkaline developer or hydrogen peroxide solution) used for the production of semiconductor elements. Specifically, the percent film thickness reduction is generally 6% or less, preferably 5% or less, more preferably 4% or less, still more preferably 3% or less, much more preferably 2% or less, much more preferably 1% or more, most preferably 0%. The percent film thickness reduction may be calculated by the following formula: the film thickness (nm) after immersion/the film thickness (nm) before immersion×100.

As described above, the release layer formed from the releasing agent composition of the present invention can be suitably removed by use of a cleaning agent composition. Such a composition generally contains a salt and a solvent.

One preferred cleaning agent composition is such a composition containing a quaternary ammonium salt and a solvent.

No particular limitation is imposed on the quaternary ammonium salt, so long as the salt is composed of a quaternary ammonium cation and an anion and is used for such applications.

A typical example of the quaternary ammonium cation is a tetra(hydrocarbyl)ammonium cation. Examples of the counter anion include, but are not limited to, a hydroxide ion ($OH^-$); halide anions such as fluoride ($F^-$), chloride ($Cl^-$), bromide ($Br^-$), and iodide ($I^-$); a tetrafluoroborate ion ($BF_4^-$); and a hexafluorophosphate ion ($PF_6^-$).

In the present invention, the quaternary ammonium salt is preferably a halogen-containing quaternary ammonium salt, more preferably a fluorine-containing quaternary ammonium salt.

In the quaternary ammonium salt, the halogen atom(s) may be present in the cation moiety or the anion moiety and is/are preferably present in the anion moiety.

In one preferred embodiment, the fluorine-containing quaternary ammonium salt is a tetra(hydrocarbyl)ammonium fluoride.

Specific examples of the hydrocarbyl group of the tetra (hydrocarbyl)ammonium fluoride include a C1 to C20 alkyl group, a C2 to C20 alkenyl group, a C2 to C20 alkynyl group, and a C6 to C20 aryl group.

In a more preferred embodiment, the tetra(hydrocarbyl) ammonium fluoride includes tetraalkylammonium fluoride.

Specific examples of the tetraalkylammonium fluoride include, but are not limited to, tetramethylammonium fluoride, tetraethylammonium fluoride, tetrapropylammonium fluoride, and tetrabutylammonium fluoride. Of these, tetrabutylammonium fluoride is preferred.

The quaternary ammonium salt such as tetra(hydrocarbyl) ammonium fluoride used herein may be a hydrate thereof. Also, quaternary ammonium salts such as tetra(hydrocarbyl) ammonium fluorides may be used singly or in combination of two or more species.

No particular limitation is imposed on the amount of the quaternary ammonium fluoride, so long as it can be dissolved in the solvent contained in the cleaning agent composition. The amount is generally 0.1 to 30 mass % based on the amount of the cleaning agent composition.

No particular limitation is imposed on the solvent contained in the cleaning agent composition employed in the present invention, so long as it is used for such purposes and can dissolve the aforementioned quaternary ammonium salt and other salts. From the viewpoints of, for example, providing cleaning agent compositions exhibiting excellent cleaning performance at high reproducibility and cleaning agent compositions which can favorably dissolve a salt such as a quaternary ammonium salt, to thereby achieve high uniformity, the cleaning agent composition used in the present invention preferably contains one or more amide solvents.

Examples of preferred amide solvents include an amide (i.e., acid amide) derivative represented by formula (Z).

[F22]

(Z)

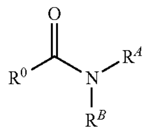

In formula (Z), $R^0$ represents an ethyl group, a propyl group, or an isopropyl group, with ethyl and isopropyl being preferred, and ethyl being more preferred. Each of $R^A$ and $R^B$ represents a C1 to C4 alkyl group. The C1 to C4 alkyl group may be linear-chain, branched-chain, or cyclic. Specific examples include methyl, ethyl, propyl, isopropyl, cyclopropyl, n-butyl, isobutyl, s-butyl, t-butyl, and cyclobutyl. Among them, each of $R^A$ and $R^B$ is preferably methyl or ethyl.

Examples of the amide derivative represented by formula (Z) include N,N-dimethylpropionamide, N,N-diethylpropionamide, N-ethyl-N-methylpropionamide, N,N-dimethylbutyramide, N,N-diethylbutyramide, N-ethyl-N-methylbutyramide, N,N-dimethylisobutyramide, N,N-diethylisobutyramide, and N-ethyl-N-methylisobutyramide. Of these, N,N-dimethylpropionamide is preferred.

The amide derivative represented by formula (Z) may be synthesized through substitution of a corresponding carboxylate ester with a corresponding amine. Alternatively, a commercial product of the amide derivative may also be used.

Examples of other preferred amide solvents include a lactam compound represented by formula (Y).

[F23]

(Y)

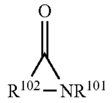

Specific examples of the C1 to C6 alkyl group in formula (Y) include, but are not limited to, methyl, ethyl, n-propyl, and n-butyl. Specific examples of the C1 to C6 alkylene group include, but are not limited to, methylene, ethylene, trimethylene, tetramethylene, pentamethylene, and hexamethylene.

Specific examples of the lactam compound represented by formula (Y) include an α-lactam compound, a β-lactam compound, a γ-lactam compound, and a δ-lactam compound. These lactam compounds may be used singly or in combination of two or more species.

In one preferred embodiment of the present invention, the lactam compound represented by formula (Y) includes a 1-alkyl-2-pyrrolidone (N-alkyl-γ-butyrolactam). In a more preferred embodiment, the lactam compound includes N-methylpyrrolidone (NMP) or N-ethylpyrrolidone (NEP). In a still more preferred embodiment, the lactam compound includes N-methylpyrrolidone (NMP).

The cleaning agent composition used in the present invention may contain one or more additional organic solvents other than the aforementioned amide compound.

No particular limitation is imposed on the additional organic solvent, so long as the additional organic solvent is used for such applications and is compatible with the aforementioned amide compound.

Examples of preferred additional solvents include, but are not limited to, an alkylene glycol dialkyl ether, an aromatic hydrocarbon compound, and an ether compound having a cyclic moiety.

Generally, the amount of the additional organic solvent(s) other than the aforementioned amide compound is appropriately tuned to be 95 mass % or smaller of the entire solvent contained in the cleaning agent composition, so long as the quaternary ammonium salt contained in the cleaning agent composition does not deposit or segregate and can be uniformly miscible with the aforementioned amide compound.

Meanwhile, the cleaning agent composition used in the present invention may contain water as a solvent. However, generally, the solvent is intentionally prepared from only organic solvent(s), from the viewpoint of, for example, avoiding damage of substrates such as corrosion. Notably, in this case, a hydration water of a salt or a microamount of water present in the organic solvent(s) may be unavoidably incorporated into the cleaning agent composition. However, the present invention does not exclude such a case. The water content of the cleaning agent composition used in the present invention is generally 5 mass % or less.

The advantageous feature of the release layer formed from the releasing agent composition of the present invention; i.e., being suitably removed by use of a cleaning agent composition, can be also assessed by the index of percent film thickness reduction (%), according to the aforementioned procedure.

After immersion of the release layer formed from the releasing agent composition of the present invention in a cleaning agent composition through the aforementioned procedure, the percent film thickness reduction is generally 94% or more. The release layer exhibits a percent reduction of 95% or more in a preferred embodiment, 96% or more in a more preferred embodiment, 97% or more in a still more preferred embodiment, 98% or more in a yet more preferred embodiment, 99% or more in a further more preferred embodiment, 100% in a most preferred embodiment.

The adhesive layer included in the laminate of the present invention may be a film produced from, for example, an adhesive composition containing an adhesive component (S).

No particular limitation is imposed on the adhesive component (S), so long as the component is used for such applications. Examples thereof include, but are not limited to, a polysiloxane adhesive, an acrylic resin adhesive, an epoxy resin adhesive, a polyamide adhesive, a polystyrene adhesive, a polyimide adhesive, and a phenolic resin adhesive.

Among them, a polysiloxane adhesive is preferred as the adhesive component (S), since the polysiloxane adhesive provides suitable binding performance in processing of a workpiece such as a wafer, can be suitably removed after processing, has excellent heat resistance, and can be suitably removed by use of the aforementioned cleaning composition.

In one preferred embodiment, the adhesive composition used in the present invention contains, as an adhesive component, a polyorganosiloxane component (A) which is curable through hydrosilylation. In a more preferred embodiment, the polyorganosiloxane component (A) which is curable through hydrosilylation contains a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q"), a siloxane unit represented by $R^{1''}R^{2''}R^{3''}SiO_{1/2}$ (unit M"), a siloxane unit represented by $R^{4''}R^{5''}SiO_{2/2}$ (unit D"), and a siloxane unit represented by $R^{6''}SiO_{3/2}$ (unit T"), and at least one unit selected from the group consisting of unit M", unit D", and unit T".

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. However, a linear-chain or branched-chain alkyl group is preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched-chain alkyl group are the same as those of the optionally substituted linear-chain or branched-chain alkyl group as mentioned in relation to $R^{901}$ and $R^{902}$. Of these, a methyl group is preferred.

Specific examples of the cyclic alkyl group are the same as those of the optionally substituted cyclic alkyl group as mentioned in relation to $R^{901}$ and $R^{902}$.

The alkenyl group may be linear-chain, branched-chain, or cyclic. No particular limitation is imposed on the number of carbon atoms thereof, and the number of carbon atoms is generally 2 to 40, preferably 30 or less, more preferably 20 or less, still more preferably 10 or less.

Specific examples of the alkenyl group are the same as those of the optionally substituted alkenyl group as mentioned in relation to $R^{901}$ and $R^{902}$. Of these, an ethenyl group and a 2-propenyl group are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2). As a result, a cured film is yielded.

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) is generally 500 to 1,000,000. From the viewpoint of attaining the effects of the present invention at high reproducibility, the weight average molecular weight is preferably 5,000 to 50,000.

Meanwhile, in the present invention, the weight average molecular weight, number average molecular weight, and polydispersity may be determined by means of, for example, a GPC apparatus (EcoSEC, HLC-8320GPC, products of Tosoh Corporation) and GPC columns (TSKgel SuperMultiporeHZ-N and TSKgel SuperMultiporeHZ-H, products of Tosoh Corporation) at a column temperature of 40° C. and a flow rate of 0.35 mL/min by use of tetrahydrofuran as an eluent (extraction solvent) and polystyrene (product of Sigma-Aldrich) as a standard substance.

The viscosity of each of the polyorganosiloxane (a1) and the polyorganosiloxane (a2) is generally 10 to 1,000,000 (mP·s). From the viewpoint of attaining the effects of the present invention at high reproducibility, the viscosity is preferably 50 to 10,000 (mP·s). Notably, in the present invention, the viscosity is measured at 25° C. by means of an E-type rotational viscometer.

The polyorganosiloxane (a1) and the polyorganosiloxane (a2) react with each other via hydrosilylation, to thereby form a film. Thus, the curing mechanism differs from the mechanism of curing mediated by, for example, silanol groups. Therefore, neither of the siloxanes is required to have a silanol group or a functional group forming a silanol group through hydrolysis (e.g., an alkyloxy group).

In one preferred embodiment of the present invention, the adhesive component (S) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress progress of hydrosilylation, the polyorganosiloxane component (A) may contain a polymerization inhibitor (A3).

No particular limitation is imposed on the polymerization inhibitor, so long as it can suppress the progress of hydrosilylation. Specific examples of the polymerization inhibitor include alkynyl alcohols such as 1-ethynyl-1-cyclohexanol and 1,1-diphenyl-2-propyn-1-ol.

Generally, the amount of polymerization inhibitor with respect to the total amount of the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition used in the present invention may contain a releasing agent component (B). Through incorporation of the releasing agent component (B) into the adhesive composition used in the present invention, the adhesive layer formed therefrom can be suitably peeled at high reproducibility.

A typical example of the releasing agent component (B) is a polyorganosiloxane. Specific examples of the polyorganosiloxane include, but are not limited to, an epoxy-group-containing polyorganosiloxane, a methyl-group-containing polyorganosiloxane, and a phenyl-group-containing polyorganosiloxane.

Examples of preferred polyorganosiloxanes (i.e., release agent component (B)) include, but are not limited to, an epoxy-group-containing polyorganosiloxane, a methyl-group-containing polyorganosiloxane, and a phenyl-group-containing polyorganosiloxane.

The polyorganosiloxane serving as the releasing agent component (B) generally has a weight average molecular weight of 100,000 to 2,000,000. The weight average molecular weight is preferably 200,000 to 1,200,000, more preferably 300,000 to 900,000, from the viewpoint of attaining the effects of the present invention at high reproducibility. The polyorganosiloxane generally has a polydispersity of 1.0 to 10.0. The polydispersity is preferably 1.5 to 5.0, more preferably 2.0 to 3.0, from the viewpoint of, for example, achieving suitable debonding at high reproducibility. Notably, the weight average molecular weight and the polydispersity may be measured through the aforementioned methods in relation to polysiloxane.

The polyorganosiloxane serving as the releasing agent component (B) generally has a viscosity of 1,000 to 2,000,000 $mm^2/s$. Notably, the viscosity of the polyorganosiloxane (i.e., the releasing agent component (B)) is a kinematic viscosity (unit: $cSt=mm^2/s$), which may also be calculated by dividing viscosity (mPa·s) by density ($g/cm^3$). Specifically, the value of kinematic viscosity may be obtained from the viscosity as measured at 25° C. an E-type rotary viscometer and the density and calculated by the equation: kinematic viscosity ($mm^2/s$)=viscosity (mPa·s)/density ($g/cm^3$).

The epoxy-group-containing polyorganosiloxane includes such a siloxane containing a siloxane unit represented by, for example, $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxypropyl and 2-(3,4-epoxycyclohexyl)ethyl.

In the present invention, examples of preferred epoxy-group-containing polyorganosiloxanes include, but are not limited to, epoxy-containing polydimethylsiloxane.

The epoxy-group-containing polyorganosiloxane contains the aforementioned siloxane unit (unit $D^{10}$), but may also contain the aforementioned unit Q, unit M and/or unit T, in addition to unit $D^{10}$.

In one preferred embodiment of the present invention, specific examples of the epoxy-group-containing polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-group-containing polyorganosiloxane is preferably an epoxy-group-containing polydimethylsiloxane having an epoxy value of 0.1 to 5. The weight average molecular weight thereof is generally 1,500 to 500,000, but preferably 100,000 or lower, for the purpose of suppression of precipitation in the adhesive.

Specific examples of the epoxy-group-containing polyorganosiloxane include, but are not limited to, those represented by formulas (E1) to (E3):

[F24]

(E1)

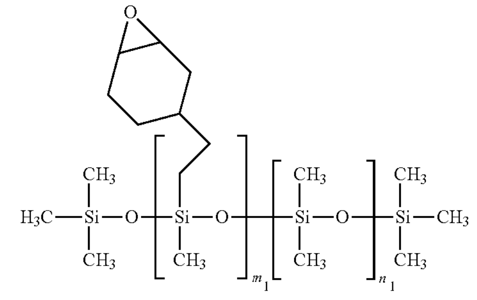

(wherein each of $m_1$ and $n_1$ represents the number of repeating units and is a positive integer);

[F25]

(E2)

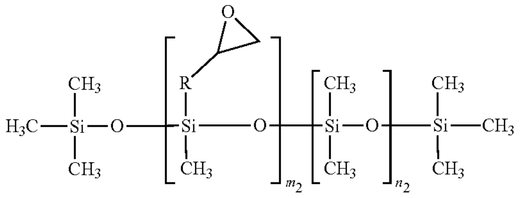

(wherein each of $m_2$ and $n_2$ represents the number of repeating units and is a positive integer, and R represents a C1 to C10 alkylene group); and

[F26]

(E3)

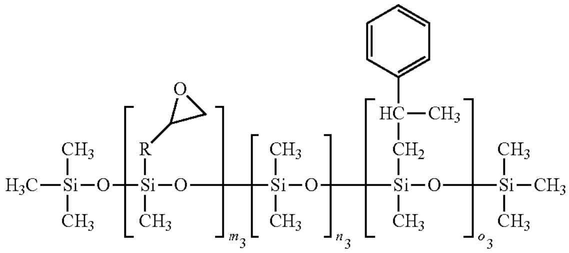

(wherein each of $m_3$, $n_3$ and $o_3$ represents the number of repeating units and is a positive integer, and R represents a C1 to 010 alkylene group).

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

In the present invention, examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment of the present invention, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment of the present invention, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

Specific examples of the methyl-group-containing polyorganosiloxane include, but are not limited to, a polyorganosiloxane represented by formula (M1):

[F27]

(M1)

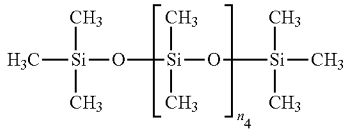

(wherein $n_4$ represents the number of repeating units and is a positive integer).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment of the present invention, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

Specific examples of the methyl-group-containing polyorganosiloxane include, but are not limited to, a polyorganosiloxane represented by formula (P1) or (P2):

[F28]

(P1)

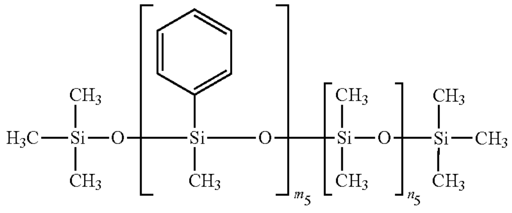

(wherein each of $m_5$ and $n_5$ represents the number of repeating units and is a positive integer); or

[F29]

(P2)

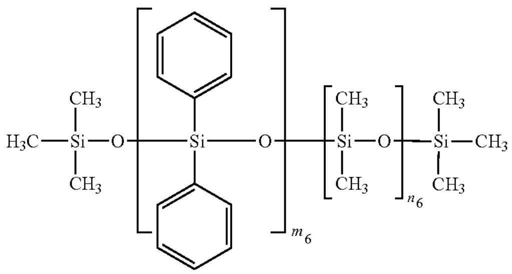

(wherein each of $m_6$ and $n_6$ represents the number of repeating units and is a positive integer).

In one preferred embodiment, the adhesive composition used in the present invention contains the polyorganosiloxane component (A) which is curable through hydrosilylation and the releasing agent component (B). In a preferred embodiment, the adhesive composition contains a polyorganosiloxane as the releasing agent component (B).

The adhesive composition used in the present invention may contain the adhesive component (S) and the releasing agent component (B) at any ratio. In consideration of the balance between adhesiveness and peelability, the ratio by mass of component (S) to component (B) is preferably 99.995:0.005 to 30:70, more preferably 99.9:0.1 to 75:25.

In other words, when the adhesive composition contains the polyorganosiloxane component (A) which is curable through hydrosilylation, the ratio by mass of component (A) to component (B) is preferably 99.995:0.005 to 30:70, more preferably 99.9:0.1 to 75:25.

For the purpose of adjusting the viscosity or for other reasons, the adhesive composition used in the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition used in the present invention contains a solvent, the amount of the solvent content is appropriately adjusted in consideration of a target viscosity of the composition, the application method to be employed, the thickness of the formed thin film, etc. The solvent content of the entire adhesive composition is generally about 10 to about 90 mass %.

The viscosity (25° C.) of the adhesive composition used in the present invention is generally 500 to 20,000 mPa·s, preferably 1,000 to 5,000 mPa·s. In consideration of various factors such as the application method to be employed and the thickness of the formed thin film, the viscosity of the adhesive composition of the present invention may be adjusted by modifying the type and composition of the organic solvent employed, the film-forming component concentration, etc.

The adhesive composition used in the present invention may be produced by mixing the adhesive component (S) and a solvent with the releasing agent component (B) which is optionally used.

No particular limitation is imposed on the sequential order of mixing, so long as the adhesive composition can be easily produced at high reproducibility. One possible example of the production method includes dissolving the adhesive component (S) and the releasing agent component (B) in a solvent. Another possible example of the production method includes dissolving a part of the adhesive component (S) and the releasing agent component (B) in a solvent, dissolving the remaining components in another solvent, and mixing the two thus-obtained solutions. However, the production method is not limited to the above examples. Notably, so long as the relevant components are not decomposed or denatured in preparation of the adhesive composition, the mixture may be appropriately heated.

In the present invention, in order to remove foreign substances present in the adhesive composition, the composition may be filtered through a sub-micrometer filter or the like in the course of production of the composition or after mixing all the components.

The adhesive layer included in the laminate of the present invention generally has a thickness of 5 to 500 μm. From the viewpoint of securing film strength, the thickness is preferably 10 μm or more, more preferably 20 μm or more, still more preferably 30 μm or more. From the viewpoint of avoiding inhomogeneity possibly due to a large film thickness, the thickness is preferably 200 μm or less, more preferably 150 μm or less, still more preferably 120 μm or less, much more preferably 70 μm or less.

The laminate of the present invention can be produced through, for example, a method including a first step of applying the adhesive composition onto a surface of a semiconductor substrate and, if required, optionally heating the composition, to thereby form an adhesive coating layer; a second step of applying the releasing agent composition onto a surface of a support substrate and, if required, optionally heating the composition, to thereby form a releasing agent coating layer; and a third step of bringing the adhesive coating layer of the semiconductor substrate into close contact with the releasing agent coating layer of the support substrate under application of a load in a thickness direction of the semiconductor substrate and the support substrate, while performing at least one of heat treatment and reduced pressure treatment, followed by performing post-heat treatment, to thereby produce a laminate.

Also, the laminate of the present invention can be produced through, for example, a method including a first step of applying the releasing agent composition onto a surface of a semiconductor substrate and, if required, optionally heating the composition, to thereby form a releasing agent coating layer; a second step of applying the adhesive composition onto a surface of a support substrate and, if required, optionally heating the composition, to thereby form an adhesive coating layer; and a third step of bringing the releasing agent coating layer of the semiconductor substrate into close contact with the adhesive coating layer of the support substrate under application of a load in a thickness direction of the semiconductor substrate and the support substrate, while performing at least one of heat treatment and reduced pressure treatment, followed by performing post-heat treatment, to thereby produce a laminate.

Notably, so long as the effects of the present invention are not impaired, the respective compositions may be sequentially applied to and heated on either of the substrates.

No particular limitation is imposed on the application method, and spin coating is generally performed. In an alternative method, a coating film is separately formed through spin coating or a similar technique, and the sheet-form coating film is attached to serve as the adhesive coating layer or the releasing agent coating layer.

The temperature of heating the applied adhesive composition cannot unequivocally be determined, since the temperature varies depending on, for example, the type or amount of the adhesive component contained in the adhesive composition, the presence or absence of a solvent in the composition, the boiling point of the solvent used, or the target thickness of the adhesive layer. However, the heating temperature is generally 80° C. to 150° C., and the heating time is generally 30 seconds to 5 minutes.

When the adhesive composition contains a solvent, the applied adhesive composition is usually heated.

The temperature of heating the applied releasing agent composition cannot unequivocally be determined, since the temperature varies depending on, for example, the type or amount of the acid generator, the boiling point of the solvent used, the target thickness of the release layer. However, the temperature is 80° C. or higher from the viewpoint of forming a suitable release layer at high reproducibility, and the temperature is 300° C. or lower from the viewpoint of suppressing the decomposition of the acid generator. The heating time is appropriately determined in response to the heating temperature and is generally 10 seconds to 10 minutes.

When the releasing agent composition contains a solvent, generally, the applied composition is heated.

The heating may be performed by means of a hot plate, an oven, or the like.

The adhesive coating layer formed through application and heating of the adhesive composition generally has a thickness of about 5 to about 500 μm. The thickness is appropriately determined so that the thickness of the adhesive layer finally falls within the aforementioned range.

The releasing agent coating layer formed through application and heating of the releasing agent composition generally has a thickness of about 10 nm to about 10 μm. The thickness is appropriately determined so that the thickness of the release layer finally falls within the aforementioned range.

The laminate of the present invention can be produced by bringing these coating layers into contact with each other, and closely binding these two layers under application of a load in a thickness direction of the semiconductor substrate and the support substrate while performing heat treatment or reduced pressure treatment or both of these treatments, followed by post-heat treatment. The choice of the heat treatment, the reduced pressure treatment, or both of these treatments in combination is determined in consideration of various factors, including the type of the adhesive composition, the specific composition of the releasing agent composition, the compatibility between films formed from these compositions, the film thickness, and the target bonding strength.

Generally, the heat treatment is performed at a temperature appropriately selected from a range of 20 to 150° C., from the viewpoints of, for example, softening the adhesive coating layer to achieve suitable bonding to the releasing agent coating layer, and suitable curing of an organic resin or the like which cannot be sufficiently cured at a temperature of heating for forming the releasing agent coating layer. Particularly, the heat treatment is preferably performed at 130° C. or lower, more preferably at 90° C. or lower, from the viewpoint of suppressing or avoiding excessive curing or undesired denaturation of the adhesive component (S). The heating time is generally 30 seconds or longer, preferably 1 minute or longer, from the viewpoint of securing the adhesive performance, and is generally 10 minutes or shorter, preferably 5 minutes or shorter, from the viewpoint of suppressing denaturation of the adhesive layer or another member.

In the reduced pressure treatment, the adhesive coating layer and the releasing agent coating layer, being in contact with each other, are placed in an atmosphere at 10 Pa to 10,000 Pa. The time of the reduced pressure treatment is generally 1 to 30 minutes.

From the viewpoint of producing, at high reproducibility, a laminate whose substrate can be suitably removed, the adhesive coating layer and the releasing agent coating layer, being in contact with each other, are bonded together preferably through reduced-pressure treatment, more preferably through heating treatment in combination of reduced-pressure treatment.

No particular limitation is imposed on the load which is applied to the semiconductor substrate and the support substrate in a thickness direction, so long as the semiconductor substrate, the support substrate, and the two layers disposed therebetween are not damaged, and these elements are closely bound. The load is generally 10 to 1,000 N.

The temperature of post-heating is preferably 120° C. or higher from the viewpoint of, for example, attaining sufficient curing rate, and preferably 260° C. or lower from the viewpoint of, for example, preventing deterioration of the substrates and other component layers.

The post-heating time is generally 1 minute or longer, preferably 5 minutes or longer, from the viewpoint of achieving suitable joining of the substrates and layers forming the laminate. Also, the post-heating time is generally 180 minutes or shorter, preferably 120 minutes or shorter, from the viewpoint of preventing or avoiding, for example, an adverse effect on the component layers due to excessive heating.

Heating may be performed by means of a hot plate, an oven, or the like. In the case where the post-heating is performed by means of a hot plate, the laminate may be placed so that either the semiconductor substrate or the support substrate thereof is located at a lower position. However, from the viewpoint of achieving suitable debonding at high reproducibility, the semiconductor substrate is preferably located at a lower position.

Notably, one purpose of performing post-heating is to more suitably form the adhesive layer and the release layer, which is a self-standing film, particularly to attain more suitable curing via hydrosilylation.

The processed semiconductor substrate production method of the present invention includes a first step of processing a semiconductor substrate of the laminate of the present invention, a second step of separating the semiconductor substrate from the support substrate; and a third step of cleaning the separated semiconductor substrate with a cleaning agent composition.

In the first step, the processing performed with respect to the semiconductor substrate is, for example, processing of a back surface of a wafer (i.e., the surface opposite the circuit-furnished surface of the wafer), and typical examples of the processing include thinning a wafer by polishing (grinding) the backside thereof. Thereafter, the thinned wafer is provided with through silicon vias (TSVs) and the like and then removed from the support substrate. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is unavoidably applied to the laminate bonded to the support. The laminate of the present invention including the adhesive layer and the release layer has heat resistance to the load.

Notably, the processing is not limited to the aforementioned process and may include, for example, a semiconductor element-mounting process of a substrate onto which the semiconductor element is to be mounted, wherein the substrate has been temporarily bonded to a support substrate for being supported by the support substrate.

In the second step, no particular limitation is imposed on the method of separating (peeling) the semiconductor substrate from the support substrate, and examples of the method include debonding with laser light, mechanical debonding by means of a machine member having a sharp part, and peeling of the support from the target wafer.

When the support substrate is light-transmissive, delamination or decomposition is evoked in the release layer as described above by irradiating the release layer with light from the support substrate side. Subsequently, any of the substrates is pulled up, to thereby easily separate the semiconductor substrate from the support substrate.

The light radiation to the release layer is not necessarily performed to the entire area of the release layer. Even when the release layer has both a light-irradiated area and a light-non-irradiated area, the semiconductor substrate can be separated from the support substrate through application of small external force (e.g., pulling a support substrate), if the debonding performance of the entire release layer is satisfactorily enhanced. The ratio of the light-irradiated area to the light-non-irradiated area, and the locational distribution of the two areas vary depending on the type and specific composition of the adhesive composition employed, the thickness of the adhesive layer, the thickness of the release layer, the intensity of light irradiation, and other factors. However, those skilled in the art can set appropriate conditions, without carrying out excessive tests. Under such circumstances, according to the processed semiconductor substrate production method of the present invention, the time of irradiating the support substrate (peeling target) of the laminate employed, the support substrate being light-transmissive, can be shortened. As a result, improvement in through-put is expected. Furthermore, the semiconductor substrate can be easily and effectively separated from the support substrate by way of light irradiation, with avoiding application of physical stress for conducting debonding and the like.

The irradiation dose of light for debonding is generally 50 to 3,000 mJ/cm$^2$. The irradiation time is appropriately determined in accordance with the wavelength and dose of the light.

Light radiation may be performed through laser light or non-laser light obtained from a light source such as a UV lamp.

In the third step, the separated semiconductor substrate is cleaned by spraying a cleaning agent composition to the surface of the substrate or by immersing the substrate in a cleaning agent composition. Subsequently, the thus-cleaned semiconductor substrate is generally rinsed with a solvent and dried. Notably, examples of the cleaning agent composition are the same as mentioned above.

In the processed semiconductor substrate production method of the present invention, the processed semiconductor substrate obtained in the third step is suitably cleaned by the cleaning agent composition. However, the surface of the processed semiconductor substrate may further be cleaned by use of a remover tape or the like. If needed, the surface may be further cleaned by use of a remover tape or the like.

The aforementioned technical and methodological elements involved in the processed semiconductor substrate production method of the present invention may be modified in various manners, so long as the modification does not deviate from the gist of the present invention.

Needless to say, the processed semiconductor substrate production method of the present invention may further include an additional step other than the aforementioned steps.

In a procedure of the debonding method of the present invention, when the support substrate of the laminate of the present invention is light-transmissive, the release layer of the laminate is irradiated with light from the support substrate side, whereby the semiconductor substrate of the laminate is separated from the support substrate thereof.

In the laminate of the present invention, the semiconductor substrate and the support substrate are preliminarily bonded in a favorably peelable manner by the mediation of the adhesive layer and the release layer. Thus, when the support substrate is light-transmissive, the semiconductor substrate can be easily separated from the support substrate by irradiating the release layer of the laminate with light from the support substrate side. Generally, such debonding is performed after completion of processing of the semiconductor substrate of the laminate.

EXAMPLES

[Apparatus]

(1) Agitator: Planetary centrifugal mixer ARE-500 (product of Thinky Corporation)
(2) Rheometer: Rheometer MCR302 (product of Anton Paar Japan K.K.)
(3) Vacuum bonding apparatus: Manual Bonder (product of Suss MicroTec)
(4) High rigid grinder: HRG300 (product of Tokyo Seimitsu Co., Ltd.)
(5) 5% Weight loss temperature measurement apparatus: 2010SR (ambient temperature to 400° C. (elevation: 10° C./min) in air) (product of NETZSCH)
(6) Optical film thickness meter (film thickness measurement): F-50 (product of Filmetrics Japan, Inc.)
(7) Laser: Lambda SX (product of Coherent, Inc.)

[Determination of Molecular Weight of Polysilane]

The weight average molecular weight of polysilane was determined by means of a GPC apparatus (EcoSEC, HLC-8220GPC, products of Tosoh Corporation) and GPC columns (Shodex KF-803L, KF-802, and KF-801, products of Showa Denko K.K., employed in this order). The column temperature was 40° C. Tetrahydrofuran was used as an eluent (i.e., extraction solvent). Flow rate was adjusted to 1.00 mL/min. Polystyrene (product of Sigma-Aldrich) was used as a standard substance.

[1] Preparation of Adhesive Composition

Preparation Example 1

To a 600-mL container dedicated for an agitator, there were added an MQ resin having a polysiloxane structure and vinyl groups (product of WACKER Chemie AG) (80 g), SiH-group-containing linear-chain polydimethylsiloxane (viscosity: 100 mPa·s) (product of WACKER Chemie AG) (2.52 g), SiH-group-containing linear-chain polydimethylsiloxane (viscosity: 70 mPa·s) (product of WACKER Chemie AG) (5.89 g), and 1-ethynyl-1-cyclohexanol (product of WACKER Chemie AG) (0.22 g). The obtained mixture was agitated by means of the agitator for 5 minutes.

Separately, a platinum catalyst (product of WACKER Chemie AG) (0.147 g) and vinyl-group-containing linear-chain polydimethylsiloxane (viscosity: 1,000 mPa·s) (product of WACKER Chemie AG) (5.81 g) were agitated by means of an agitator for 5 minutes, and a portion (3.96 g) of the mixture was added to the above mixture. The thus-combined mixture was agitated by means of an agitator for 5 minutes.

Finally, the resultant mixture was filtered through a nylon filter (300 mesh), to thereby prepare an adhesive composition.

[2] Preparation of Cleaning Agent Composition

Preparation Example 2

Tetrabutylammonium fluoride trihydrate (product of Kanto Chemical Co., Inc.) (5 g) was mixed with N-methyl-2-pyrrolidone (95 g), and the thus-obtained mixture was sufficiently agitated, to thereby prepare a cleaning agent composition.

[3] Synthesis of Novolak Resin

Synthesis Example 1

N-Phenyl-1-naphthylamine (56.02 g), 1-pyrenecarboxaldehyde (50.00 g), 4-(trifluoromethyl)benzaldehyde (6.67 g), and methanesulfonic acid (2.46 g) were added to a flask, and then 1,4-dioxane (86.36 g) and toluene (86.36 g) were added to the flask. The resultant mixture was stirred under reflux in a nitrogen atmosphere for 18 hours.

The reaction mixture was left to cool, and then tetrahydrofuran (96 g) was added to the mixture for dilution. The thus-diluted mixture was added dropwise to methanol, to thereby yield a precipitate. The precipitate was recovered through filtration, and the filtrate was washed with methanol, followed by drying under reduced pressure at 60° C., to thereby produce a novolak resin (72.12 g) (hereinafter abbreviated as "PPNAPCA-F"). The weight-average molecular weight of the novolak resin (i.e., polymer), measured through the aforementioned method, was found to be 1,100.

[4] Preparation of Releasing Agent Composition

Comparative Example 1-1

The novolak resin produced in Synthesis Example 1 (3.6 g) and 3,3',5,5'-tetrakis(methoxymethyl)-[1,1'-biphenyl]-4,4'-diol (hereinafter referred to as "TMOM-BP") (0.72 g) serving as a cross-linking agent were dissolved in propylene glycol monomethyl ether acetate (95.68 g), and the resultant solution was filtered with a polyethylene-made microfilter (pore size: 0.2 μm), to thereby prepare a releasing agent composition.

Comparative Example 1-2

The novolak resin produced in Synthesis Example 1 (3.6 g), TMOM-BP (0.72 g) serving as a cross-linking agent, and pyridinium p-toluenesulfonate (0.1 g) were dissolved in propylene glycol monomethyl ether acetate (95.58 g), and the resultant solution was filtered with a polyethylene-made microfilter (pore size: 0.2 μm), to thereby prepare a releasing agent composition.

Example 1

The novolak resin produced in Synthesis Example 1 (3.6 g), TMOM-BP (0.72 g) serving as a cross-linking agent, and OGSOL SI-20-10 (product of Osaka Gas Chemicals Co., Ltd.) (3.6 g) serving as a branched-chain polysilane were dissolved in propylene glycol monomethyl ether acetate (92.08 g), and the resultant solution was filtered with a polyethylene-made microfilter (pore size: 0.2 μm), to thereby prepare a releasing agent composition. OGSOL SI-20-10 is a branched-chain polysilane represented by formula (B-1). OGSOL SI-20-10 was found to have a weight-average molecular weight of $1.7\times10^3$ and a 5% weight loss temperature of higher than 400° C. as determined by the aforementioned methods.

[F30]

(B-1)

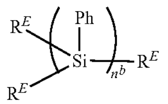

(Ph represents a phenyl group; $R^E$ represents a terminal substituent (atom or group); and $n^b$ represents the number of repeating units.)

Comparative Example 1-3

The novolak resin produced in Synthesis Example 1 (3.6 g), TMOM-BP (0.72 g) serving as a cross-linking agent, and OGSOL SI-10-10 (product of Osaka Gas Chemicals Co., Ltd.) (3.6 g) serving as a linear-chain polysilane were dissolved in propylene glycol monomethyl ether acetate (92.08 g), and the resultant solution was filtered with a polyethylene-made microfilter (pore size: 0.2 μm), to thereby prepare a releasing agent composition. OGSOL SI-10-10 is a linear-chain polysilane represented by formula (S-1). OGSOL SI-10-10 was found to have a weight-average molecular weight of $1.28\times10^4$ and a 5% weight loss temperature of 370° C. as determined by the aforementioned methods.

[F31]

(S-1)

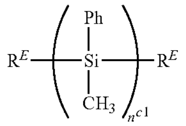

(Ph represents a phenyl group; $R^E$ represents a terminal substituent (atom or group); and $n^{c1}$ represents the number of repeating units.)

Comparative Example 1-4

The novolak resin produced in Synthesis Example 1 (3.6 g), TMOM-BP (0.72 g) serving as a cross-linking agent, and OGSOL SI-10-20 (product of Osaka Gas Chemicals Co., Ltd.) (3.6 g) serving as a linear-chain polysilane were dissolved in propylene glycol monomethyl ether acetate (92.08 g), and the resultant solution was filtered with a polyethylene-made microfilter (pore size: 0.2 μm), to thereby prepare a releasing agent composition. OGSOL SI-10-20 is a linear-chain polysilane represented by formula (S-2). OGSOL SI-10-20 was found to have a weight-average molecular weight of $2.4\times10^3$ and a 5% weight loss temperature of 390° C. as determined by the aforementioned methods.

[F32]

(S-2)

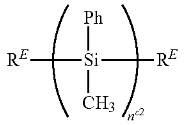

(Ph represents a phenyl group; $R^E$ represents a terminal substituent (atom or group); and $n^{c2}$ represents the number of repeating units.)

Comparative Example 1-5

The novolak resin produced in Synthesis Example 1 (3.6 g), TMOM-BP (0.72 g) serving as a cross-linking agent, and diphenylsilanediol (3.6 g) were dissolved in propylene glycol monomethyl ether acetate (92.08 g), and the resultant solution was filtered with a polyethylene-made microfilter (pore size: 0.2 μm), to thereby prepare a releasing agent composition.

[5] Determination of Film Removability (Percent Film Thickness Reduction)

Example 2

The releasing agent composition prepared in Example 1 was applied through spin coating onto a cut silicon wafer (4 cm×4 cm) so as to achieve a final film thickness of 200 nm, followed by heating at 250° C. for 15 minutes, to thereby form a film on the substrate. The required number of film-formed substrates was produced (the same shall apply hereinafter).

Comparative Examples 2-1 to 2-5

A film was formed on a substrate in the same manner as in Example 2, except that the releasing agent composition prepared in Example 1 was replaced by each of the releasing agent compositions prepared in Comparative Examples 1-1 to 1-5.

The thickness of each of the films formed in Example 2 and Comparative Examples 2-1 to 2-5 was measured (film thickness before immersion). Subsequently, the film and the substrate were immersed in the cleaning agent composition prepared in Preparation Example 2 (7 mL) for 10 minutes. Thereafter, the film was dried by means of an air gun, and the thickness of the film was measured again (film thickness after immersion).

The same operation as described above (including measurement of film thickness) was performed on each film, except that the cleaning agent composition was replaced by OK73 Thinner (components: propylene glycol monomethyl ether (70%) and propylene glycol monomethyl ether acetate (30%)) (product of TOKYO OHKA KOGYO CO., LTD.) or N-methyl-2-pyrrolidone (NMP).

The same operation as described above (including measurement of film thickness) was further performed on the film formed in Example 2, except that the cleaning agent composition was replaced by 5 mass % aqueous potassium hydroxide (KOH) solution, 10 mass % aqueous hydrochloric acid solution, 10 mass % aqueous p-toluenesulfonic acid solution, mesitylene, acetone, 2.38 mass % aqueous tetramethylammonium hydroxide solution (aqueous TMAH solution), or 35 mass % hydrogen peroxide solution.

The percent film thickness reduction (%) due to immersion was calculated by the following formula: the film thickness (nm) after immersion/the film thickness (nm) before immersion×100. The results are shown in Table 1. In Table 1, "N/D" refers to no corresponding data.

TABLE 1

| | Ex. 2 | Comp. Ex. 2-1 | Comp. Ex. 2-2 | Comp. Ex. 2-3 | Comp. Ex. 2-4 | Comp. Ex. 2-5 |
|---|---|---|---|---|---|---|
| Cleaning agent composition | 100% | 100% | 0% | 100% | 100% | 100% |
| OK73 Thinner | 0% | 100% | 0% | 49% | 55% | 100% |
| NMP | 0% | 100% | 0% | 100% | 100% | 100% |
| Aq. KOH solution | 0% | N/D | N/D | N/D | N/D | N/D |
| Aq. HCl solution | 0% | N/D | N/D | N/D | N/D | N/D |
| Aq. PTS solution | 0% | N/D | N/D | N/D | N/D | N/D |
| Mesitylene | 0% | N/D | N/D | N/D | N/D | N/D |
| Acetone | 0% | N/D | N/D | N/D | N/D | N/D |
| Aq. TMAH solution | 0% | N/D | N/D | N/D | N/D | N/D |
| Hydrogen peroxide solution | 0% | N/D | N/D | N/D | N/D | N/D |

As shown in Table 1, the film formed in Comparative Example 2-1 exhibited a percent film thickness reduction of 100% when immersed in the cleaning agent composition, OK73 Thinner, or NMP. This indicates that the film formed in Comparative Example 2-1 were dissolved in all of the cleaning agent composition, OK73 Thinner, and NMP. In contrast, the film formed in Comparative Example 2-2 exhibited a percent film thickness reduction of 0% when immersed in the cleaning agent composition, OK73 Thinner, or NMP. This indicates that the film formed in Comparative Example 2-2 was not dissolved in any of the cleaning agent composition, OK73 Thinner, and NMP. The results suggest that cross-linking reaction did not proceed in Comparative Example 2-1 (i.e., no addition of an acid catalyst), whereas cross-linking reaction proceeded in Comparative Example 2-2 (i.e., addition of an acid catalyst).

In Example 2 (i.e., no addition of an acid catalyst, but addition of a branched-chain polysilane), the resultant film exhibited a percent film thickness reduction of 0% when immersed in the respective solvents, the acidic aqueous solution, the basic aqueous solution, and the solutions widely used for the production of semiconductor elements (aqueous TMAH solution and hydrogen peroxide solution), but exhibited a percent film thickness reduction of 100% when immersed in the cleaning agent composition. Thus, the film formed in Example 2 was not suitably removed by the respective solvents, the acidic aqueous solution, the basic aqueous solution, or the solutions widely used for the production of semiconductor elements, but was suitably removed by the cleaning agent composition.

In Comparative Example 2-3 or 2-4 (i.e., addition of a linear-chain polysilane instead of a branched-chain polysilane), the resultant film exhibited a slightly higher resistance to OK73 Thinner in Comparative Example 2-4, but failed to achieve the property in the case of use of a branched-chain polysilane; i.e., the property that the film cannot be suitably removed by OK73 Thinner or NMP, but can be suitably removed by the cleaning agent composition.

In the case where diphenylsilanediol was used instead of a branched-chain polysilane, the resultant film was not determined to have resistance to the cleaning agent composition or the solvent.

[6] Production of Laminate and Determination of Debondability Through Light Irradiation and Cleanability by Cleaning Agent Composition Example 3

The releasing agent composition prepared in Example 1 was applied by spin coating onto a 301-mm glass wafer (EAGLE-XG, product of Corning, thickness: 700 μm) serving as a carrier-side substrate so that the thickness of the resultant film was 200 nm in the finally produced laminate, to thereby form a releasing agent coating layer on the glass wafer as a support substrate.

Meanwhile, the adhesive composition prepared in Preparation Example 1 was applied by spin coating onto a 300-mm silicon wafer (thickness: 775 μm) serving as a device-side substrate so that the thickness of the resultant film was 60 μm in the finally produced laminate, to thereby form an adhesive coating layer on the silicon wafer as a semiconductor substrate.

By means of a bonding apparatus, the glass wafer and the silicon wafer were bonded together so as to sandwich the releasing agent coating layer and the adhesive coating layer between the wafers. Thereafter, the resultant product was subjected to post-heat treatment at 200° C. for 10 minutes, to thereby produce a laminate. The bonding was performed at a temperature of 23° C. and a pressure reduction degree of 1,500 Pa. The required number of laminates was produced.

The silicon wafer of the resultant laminate was thinned to 50 μm by means of a high-rigidity grinder, and then the laminate was placed in an oven and subjected to high-temperature treatment at 250° C. for one hour. Subsequently, the cooled laminate was attached to a dicing tape (DU-300, product of NITTO DENKO CORPORATION) so that the thinned silicon wafer faced downward, and the laminate was fixed to the tape.

The release layer was irradiated with laser light (wavelength: 308 nm) from the glass wafer side of the fixed laminate by means of a laser irradiation apparatus, and the lowest irradiation dose required for debonding was defined as an optimal irradiation dose. Subsequently, the entire surface of the release layer was irradiated with laser light (wavelength: 308 nm) at the optimal irradiation dose from the glass wafer side of the fixed laminate, and the support substrate was manually lifted to determine whether or not debonding occurred.

After the debonding, the fixed semiconductor substrate was removed, and then each of the separated semiconductor wafer and glass wafer was cut into a size of 4 cm×4 cm. The cut wafer was immersed in the cleaning agent composition prepared in Preparation Example 2 (7 mL) for 10 minutes, and the surface of the wafer was visually observed to determine whether or not residue (e.g., the film) remained on the surface (cleanability test). After cleaning of the wafer, the cleaning agent composition was recovered and visually observed to determine whether or not foreign matter remained in the composition (foreign matter determination).

Comparative Example 3-1

The laminate was produced, debondability was determined, and the cleanability test and foreign matter determination were performed in the same manner as in Example 3, except that the releasing agent composition prepared in Example 1 was replaced by the releasing agent composition prepared in Comparative Example 2-2.

TABLE 2

| | Ex. 3 | Comp. Ex. 3-1 |
|---|---|---|
| Debonding by irradiation with laser (optimal irradiation dose) | Debondable (170 mJ) | Debondable (180 mJ) |
| State of device-side substrate after cleaning | No residue | No residue |
| State of cleaner after cleaning of device-side substrate | No foreign matter | Black foreign matter |
| State of carrier-side substrate after cleaning | No residue | Residue |
| State of cleaner after cleaning of carrier-side substrate | No foreign matter | Black foreign matter |

As shown in Table 2, in the case where the semiconductor substrate was separated from the support substrate in the laminate including the film (i.e., release layer) formed from the releasing agent composition containing a branched-chain polysilane by irradiating the release layer with light (Example 3), each of the separated substrates was suitably cleaned by the cleaning agent composition without leaving residue on the substrate. No foreign matter was observed in the cleaning agent composition used for cleaning of each substrate.

In the case where the semiconductor substrate was separated from the support substrate in the laminate including the film (i.e., release layer) formed from the releasing agent composition containing an acid catalyst (containing no polysilane) by irradiating the release layer with light (Comparative Example 3-1), after cleaning of the separated substrates, no foreign matter was observed on the semiconductor substrate on which the adhesive layer had been formed so as to be in contact with the substrate surface. In contrast, the residue was observed on the support substrate on which the release layer had been formed so as to be in contact with the substrate surface. Foreign matter was observed in the cleaning agent composition used for cleaning of each substrate.

As described hereinabove, when a film is formed from a releasing agent composition containing a branched-chain polysilane, the resultant film is suitable as a release layer exhibiting good removability or solubility even after debonding, in particular, deboning through light irradiation.

The invention claimed is:

1. A laminate comprising a semiconductor substrate, a support substrate, and an adhesive layer and a release layer disposed between the semiconductor substrate and the support substrate, wherein:

the release layer is a film formed from a releasing agent composition containing an organic resin, a branched-chain polysilane, and a solvent; and the organic resin is a polymer including one or more members selected from the group consisting of a unit represented by formula (C1-1), a unit represented by formula (C1-2), and a unit represented by formula (C1-3):

(C1-1)

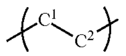

(C1-2)

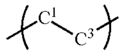

(C1-3)

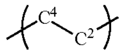

wherein:

$C^1$ represents a group derived from a nitrogen-atom containing aromatic compound;

$C^2$ represents a group including a tertiary carbon atom to which, as a side chain, at least one member selected from the group consisting of a secondary carbon atom, a quaternary carbon atom, and an aromatic ring is bonded;

$C^3$ represents a group derived from an aliphatic polycyclic compound; and $C^4$ represents a group derived from a phenol, a group derived from bisphenol, a group derived from naphthol, a group derived from biphenyl, or a group derived from biphenol, and $C^4$ contains a phenolic hydroxyl group.

2. The laminate according to claim 1, wherein the branched-chain polysilane includes a structural unit represented by formula (B):

(B)

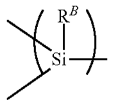

(wherein $R^B$ represents a hydrogen atom, a hydroxyl group, a silyl group, or an organic group).

3. The laminate according to claim 2, wherein $R^B$ is an aryl group.

4. The laminate according to claim 3, wherein $R^B$ is a phenyl group.

5. The laminate according to claim 1, wherein the branched-chain polysilane has a weight-average molecular weight of 50 to 30,000.

6. The laminate according to claim 1, wherein the branched-chain polysilane has a 5% weight loss temperature of 300° C. or higher.

7. The laminate according to claim 1, wherein the releasing agent composition contains a cross-linking agent.

8. The laminate according to claim 1, wherein the adhesive layer is a film formed from an adhesive composition containing an adhesive component(S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

9. The laminate according to claim 8, wherein the adhesive component(S) contains a polysiloxane adhesive.

10. The laminate according to claim 9, wherein the polysiloxane adhesive contains a polysiloxane component (A) which is curable through hydrosilylation.

11. A releasing agent composition for forming a release layer of a laminate comprising a semiconductor substrate, a support substrate, and an adhesive layer and the release layer disposed between the semiconductor substrate and the support substrate, wherein:

the releasing agent composition comprises an organic resin, a branched-chain polysilane, and a solvent; and the organic resin is a polymer including one or more members selected from the group consisting of a unit represented by formula (C1-1), a unit represented by formula (C1-2), and a unit represented by formula (C1-3):

(C1-1)

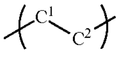

(C1-2)

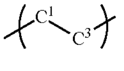

(C1-3)

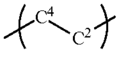

wherein:

$C^1$ represents a group derived from a nitrogen-atom containing aromatic compound;

$C^2$ represents a group including a tertiary carbon atom to which, as a side chain, at least one member selected from the group consisting of a secondary carbon atom, a quaternary carbon atom, and an aromatic ring is bonded;

$C^3$ represents a group derived from an aliphatic polycyclic compound; and $C^4$ represents a group derived from a phenol, a group derived from bisphenol, a group derived from naphthol, a group derived from biphenyl, or a group derived from biphenol, and $C^4$ contains a phenolic hydroxyl group.

12. The releasing agent composition according to claim 11, wherein the branched-chain polysilane includes a structural unit represented by formula (B):

(B)

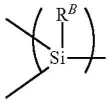

(wherein $R^B$ represents a hydrogen atom, a hydroxyl group, a silyl group, or an organic group).

13. The releasing agent composition according to claim 12, wherein $R^B$ is an aryl group.

14. The releasing agent composition according to claim 13, wherein $R^B$ is a phenyl group.

15. The releasing agent composition according to claim 11, wherein the branched-chain polysilane has a weight-average molecular weight of 50 to 30,000.

16. The releasing agent composition according to claim 11, wherein the branched-chain polysilane has a 5% weight loss temperature of 300° C. or higher.

17. The releasing agent composition according to claim 11, which contains a cross-linking agent.

18. The releasing agent composition according to claim 11, wherein the adhesive layer is a film formed from an adhesive composition containing an adhesive component (S) containing at least one species selected from among a polysiloxane adhesive, an acrylic resin adhesive, an epoxy resin adhesive, a polyamide adhesive, a polystyrene adhesive, a polyimide adhesive, and a phenolic resin adhesive.

19. The releasing agent composition according to claim 18, wherein the adhesive component(S) contains a polysiloxane adhesive.

20. The releasing agent composition according to claim 19, wherein the polysiloxane adhesive contains a polysiloxane component (A) which is curable through hydrosilylation.

21. A processed semiconductor substrate production method comprising:

processing a semiconductor substrate of the laminate of claim 1;

separating the semiconductor substrate from the support substrate; and cleaning the separated semiconductor substrate with a cleaning agent composition.

22. The processed semiconductor substrate production method according to claim 21, wherein the separating the semiconductor substrate from the support substrate includes irradiating the release layer with light.

23. The processed semiconductor substrate production method according to claim 21, wherein the cleaning agent composition contains a quaternary ammonium salt and an organic solvent.

24. The processed semiconductor substrate production method according to claim 23, wherein the quaternary ammonium salt is a halogen-containing quaternary ammonium salt.

25. The processed semiconductor substrate production method according to claim 24, wherein the halogen-containing quaternary ammonium salt is a fluorine-containing quaternary ammonium salt.

* * * * *